United States Patent
Hirakata et al.

(10) Patent No.: US 9,069,215 B2
(45) Date of Patent: Jun. 30, 2015

(54) SEMICONDUCTOR DEVICE AND METHOD OF FABRICATING THE SAME

(75) Inventors: Yoshiharu Hirakata, Kanagawa (JP); Yuugo Goto, Kanagawa (JP); Yuko Kobayashi, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/556,135

(22) Filed: Sep. 9, 2009

(65) Prior Publication Data

US 2009/0322698 A1   Dec. 31, 2009

Related U.S. Application Data

(62) Division of application No. 10/692,759, filed on Oct. 27, 2003, now Pat. No. 7,173,281, and a division of application No. 09/606,414, filed on Jun. 29, 2000, now Pat. No. 6,638,781.

(30) Foreign Application Priority Data

Jul. 6, 1999   (JP) .................................... 11-191102

(51) Int. Cl.
*H01L 27/14*   (2006.01)
*H01L 29/04*   (2006.01)
(Continued)

(52) U.S. Cl.
CPC ........ *G02F 1/13394* (2013.01); *G02F 1/13454* (2013.01); *H01L 29/78621* (2013.01); *H01L 29/78627* (2013.01); *Y10S 438/924* (2013.01); *Y10S 438/98* (2013.01);
(Continued)

(58) Field of Classification Search
USPC .............................................. 257/72, E27.111
See application file for complete search history.

(56) References Cited

U.S. PATENT DOCUMENTS 4,555,746 A   11/1985   Mochizuki et al.
4,653,864 A   3/1987   Baron et al.
(Continued)

FOREIGN PATENT DOCUMENTS

EP   0 568 355 A2   11/1993
EP   0 604 006      6/1994
(Continued)

OTHER PUBLICATIONS

Ryuichi Shimokawa et al.; "Characterization of High-Efficiency Cast-Si Solar Cell Wafers by MBIC Measurement"; Japanese Journal of Applied Physics, vol. 27, No. 5, May 20, 1988, pp. 751-758.
(Continued)

*Primary Examiner* — Matthew Landau
*Assistant Examiner* — Igwe U Anya
(74) *Attorney, Agent, or Firm* — Nixon Peabody LLP; Jeffrey L. Costellia

(57) ABSTRACT

There is provided a high quality liquid crystal panel having a thickness with high accuracy, which is designed, without using a particulate spacer, within a free range in accordance with characteristics of a used liquid crystal and a driving method, and is also provided a method of fabricating the same. The shape of a spacer for keeping a substrate interval constant is made such that it is a columnar shape, a radius R of curvature is 2 μm or less, a height H is 0.5 μm to 10 μm, a diameter is 20 μm or less, and an angle α is 65° to 115°. By doing so, it is possible to prevent the lowering of an opening rate and the lowering of light leakage due to orientation disturbance.

19 Claims, 25 Drawing Sheets

(51) Int. Cl.
    *H01L 29/15*         (2006.01)
    *H01L 31/036*       (2006.01)
    *G02F 1/1339*       (2006.01)
    *H01L 29/786*       (2006.01)
    *G02F 1/1333*       (2006.01)
    *G02F 1/1345*       (2006.01)

(52) U.S. Cl.
    CPC .... *G02F 1/13338* (2013.01); *H01L 2924/0002* (2013.01); *H01L 2029/7863* (2013.01)

(56) References Cited

U.S. PATENT DOCUMENTS

| | | | |
|---|---|---|---|
| 4,775,225 A | 10/1988 | Tsuboyama et al. | |
| 4,874,461 A | 10/1989 | Sato et al. | |
| 4,899,137 A | 2/1990 | Behrens et al. | |
| 5,003,356 A | 3/1991 | Wakai et al. | |
| 5,062,198 A | 11/1991 | Sun | |
| 5,308,998 A | 5/1994 | Yamazaki et al. | |
| 5,337,171 A | 8/1994 | Mase et al. | |
| 5,379,139 A | 1/1995 | Sato et al. | |
| 5,473,450 A | 12/1995 | Yamada et al. | |
| 5,499,123 A | 3/1996 | Mikoshiba | |
| 5,499,128 A | 3/1996 | Hasegawa et al. | |
| 5,518,078 A | 5/1996 | Tsujioka et al. | |
| 5,583,675 A | 12/1996 | Yamada et al. | |
| 5,594,569 A | 1/1997 | Konuma et al. | |
| 5,605,846 A | 2/1997 | Ohtani et al. | |
| 5,606,194 A | 2/1997 | Lebrun et al. | |
| 5,608,232 A | 3/1997 | Yamazaki et al. | |
| 5,612,803 A | 3/1997 | Yamada et al. | |
| 5,619,044 A | 4/1997 | Makita et al. | |
| 5,627,665 A | 5/1997 | Yamada et al. | |
| 5,637,515 A | 6/1997 | Takemura | |
| 5,643,826 A | 7/1997 | Ohtani et al. | |
| 5,657,104 A | 8/1997 | Kanezawa | |
| 5,666,173 A | 9/1997 | Mase et al. | |
| 5,673,127 A * | 9/1997 | Takahara et al. | 349/140 |
| 5,680,189 A | 10/1997 | Shimizu et al. | |
| 5,691,793 A | 11/1997 | Watanabe et al. | |
| 5,696,003 A | 12/1997 | Makita et al. | |
| 5,706,109 A | 1/1998 | Yamada et al. | |
| 5,717,476 A | 2/1998 | Kanezawa | |
| 5,729,318 A | 3/1998 | Yamada et al. | |
| 5,739,882 A | 4/1998 | Shimizu et al. | |
| 5,739,888 A * | 4/1998 | Ogura et al. | 349/153 |
| 5,739,889 A | 4/1998 | Yamada et al. | |
| 5,739,890 A | 4/1998 | Uda et al. | |
| 5,744,824 A | 4/1998 | Kousai et al. | |
| 5,751,382 A | 5/1998 | Yamada et al. | |
| 5,757,451 A | 5/1998 | Miyazaki et al. | |
| 5,777,701 A | 7/1998 | Zhang | |
| 5,777,713 A | 7/1998 | Kimura | |
| 5,804,882 A * | 9/1998 | Tsukagoshi et al. | 257/783 |
| 5,814,835 A | 9/1998 | Makita et al. | |
| 5,815,223 A | 9/1998 | Watanabe et al. | |
| 5,815,226 A | 9/1998 | Yamazaki et al. | |
| 5,815,232 A | 9/1998 | Miyazaki et al. | |
| 5,821,562 A | 10/1998 | Makita et al. | |
| 5,824,573 A | 10/1998 | Zhang et al. | |
| 5,831,710 A | 11/1998 | Colgan et al. | |
| 5,843,225 A | 12/1998 | Takayama et al. | |
| 5,844,643 A | 12/1998 | Onishi et al. | |
| 5,852,485 A | 12/1998 | Shimada et al. | |
| 5,852,487 A | 12/1998 | Fujimori et al. | |
| 5,879,977 A | 3/1999 | Zhang et al. | |
| 5,880,803 A | 3/1999 | Tamai et al. | |
| 5,915,174 A | 6/1999 | Yamazaki et al. | |
| 5,917,563 A | 6/1999 | Matsushima | |
| 5,917,572 A | 6/1999 | Kurauchi et al. | |
| 5,922,125 A | 7/1999 | Zhang | |
| 5,923,962 A | 7/1999 | Ohtani et al. | |
| 5,952,554 A | 9/1999 | Umeda | |
| 5,952,676 A | 9/1999 | Sato et al. | |
| 5,962,871 A | 10/1999 | Zhang et al. | |
| 5,969,784 A | 10/1999 | Miyazaki et al. | |
| 5,978,061 A | 11/1999 | Miyazaki et al. | |
| 5,978,063 A | 11/1999 | Crawford et al. | |
| 5,986,729 A | 11/1999 | Yamanaka et al. | |
| 6,013,929 A | 1/2000 | Ohtani | |
| 6,016,181 A * | 1/2000 | Shimada | 349/156 |
| 6,020,947 A | 2/2000 | Jones et al. | |
| 6,031,593 A | 2/2000 | Morikawa et al. | |
| 6,036,568 A | 3/2000 | Murouchi et al. | |
| 6,049,370 A | 4/2000 | Smith, Jr. et al. | |
| 6,064,362 A | 5/2000 | Brownlow et al. | |
| 6,069,675 A | 5/2000 | Mizobata et al. | |
| 6,088,070 A | 7/2000 | Ohtani et al. | |
| 6,088,071 A | 7/2000 | Yamamoto et al. | |
| 6,094,251 A | 7/2000 | Jones et al. | |
| 6,104,461 A | 8/2000 | Zhang et al. | |
| 6,108,064 A * | 8/2000 | Minoura et al. | 349/130 |
| 6,118,506 A | 9/2000 | Yamazaki et al. | |
| 6,124,917 A | 9/2000 | Fujioka et al. | |
| 6,141,066 A | 10/2000 | Matsushima | |
| 6,151,092 A | 11/2000 | Fujimura et al. | |
| 6,162,667 A | 12/2000 | Funai et al. | |
| 6,163,357 A * | 12/2000 | Nakamura | 349/155 |
| 6,165,824 A | 12/2000 | Takano et al. | |
| 6,204,907 B1 * | 3/2001 | Hiraishi et al. | 349/155 |
| 6,211,937 B1 * | 4/2001 | Miyachi et al. | 349/156 |
| 6,219,118 B1 | 4/2001 | Zhang | |
| 6,225,645 B1 | 5/2001 | Zhang | |
| 6,236,445 B1 | 5/2001 | Foschaar et al. | |
| 6,238,745 B1 * | 5/2001 | Morita et al. | 427/387 |
| 6,238,754 B1 | 5/2001 | Shohara et al. | |
| 6,243,069 B1 * | 6/2001 | Ogawa et al. | 345/102 |
| 6,275,061 B1 | 8/2001 | Tomita | |
| 6,275,273 B1 * | 8/2001 | Inoue | 349/40 |
| 6,281,952 B1 * | 8/2001 | Okamoto et al. | 349/12 |
| 6,285,042 B1 | 9/2001 | Ohtani et al. | |
| 6,285,247 B1 | 9/2001 | Shoji | |
| 6,286,359 B1 | 9/2001 | Umeda | |
| 6,287,733 B1 | 9/2001 | Miyazaki et al. | |
| 6,288,764 B1 | 9/2001 | Zhang et al. | |
| 6,288,766 B1 | 9/2001 | Mashiko et al. | |
| 6,313,481 B1 | 11/2001 | Ohtani et al. | |
| 6,330,047 B1 | 12/2001 | Kubo et al. | |
| 6,335,541 B1 | 1/2002 | Ohtani et al. | |
| 6,356,330 B1 * | 3/2002 | Ando et al. | 349/141 |
| 6,359,665 B1 | 3/2002 | Matsushima | |
| 6,362,865 B2 | 3/2002 | Yoshida | |
| 6,369,867 B1 | 4/2002 | Ge | |
| 6,377,328 B1 | 4/2002 | Morimoto et al. | |
| 6,404,479 B2 | 6/2002 | Zhang et al. | |
| 6,411,360 B1 | 6/2002 | Matsuyama et al. | |
| 6,420,988 B1 | 7/2002 | Azami et al. | |
| 6,445,437 B1 | 9/2002 | Miyazaki et al. | |
| RE37,945 E | 12/2002 | Kanezawa | |
| RE38,053 E | 4/2003 | Kanezawa | |
| 6,555,420 B1 | 4/2003 | Yamazaki | |
| 6,576,926 B1 | 6/2003 | Yamazaki et al. | |
| 6,577,372 B2 | 6/2003 | Zhang et al. | |
| RE38,288 E | 10/2003 | Yamada et al. | |
| 6,638,781 B1 | 10/2003 | Hirakata et al. | |
| 6,671,025 B1 | 12/2003 | Ikeda et al. | |
| 6,680,487 B1 | 1/2004 | Kokubo et al. | |
| 6,720,952 B1 * | 4/2004 | Takizawa et al. | 345/173 |
| 6,724,457 B1 | 4/2004 | Sunohara et al. | |
| 6,734,944 B1 * | 5/2004 | Koseki et al. | 349/155 |
| 6,774,957 B2 | 8/2004 | Jinno et al. | |
| 6,777,716 B1 | 8/2004 | Yamazaki et al. | |
| 6,778,248 B1 * | 8/2004 | Ootaguro et al. | 349/153 |
| 6,806,932 B2 | 10/2004 | Matsushima | |
| 6,870,592 B1 * | 3/2005 | Yamamoto et al. | 349/155 |
| 6,876,355 B1 * | 4/2005 | Ahn et al. | 345/173 |
| 6,888,608 B2 | 5/2005 | Miyazaki et al. | |
| 6,909,115 B2 | 6/2005 | Kokubo et al. | |
| 7,057,691 B2 | 6/2006 | Matsushima | |
| 7,110,059 B2 | 9/2006 | Zhang | |
| 7,173,281 B2 | 2/2007 | Hirakata et al. | |
| 7,190,418 B2 | 3/2007 | Matsushima | |
| 7,190,420 B2 | 3/2007 | Zhang | |
| 7,215,402 B2 | 5/2007 | Zhang et al. | |

(56) References Cited

U.S. PATENT DOCUMENTS

| | | | |
|---|---|---|---|
| 7,330,234 | B2 | 2/2008 | Murakami et al. |
| 7,333,160 | B2 | 2/2008 | Zhang et al. |
| 7,391,055 | B1 | 6/2008 | Murakami et al. |
| 7,474,376 | B2 | 1/2009 | Zhang et al. |
| 7,605,902 | B2 | 10/2009 | Hirakata et al. |
| 7,683,978 | B2 | 3/2010 | Zhang |
| 7,808,009 | B2 * | 10/2010 | Hirakata et al. ............... 257/83 |
| 8,023,042 | B2 | 9/2011 | Yamazaki et al. |
| 8,643,820 | B2 | 2/2014 | Zhang et al. |
| 8,665,409 | B2 | 3/2014 | Zhang et al. |
| 2001/0013909 | A1 | 8/2001 | Zhang et al. |
| 2001/0040560 | A1 | 11/2001 | Amron |
| 2001/0051398 | A1 | 12/2001 | Hirakata et al. |
| 2002/0003519 | A1 | 1/2002 | Kim |
| 2002/0013019 | A1 | 1/2002 | Ohtani et al. |
| 2002/0067450 | A1 * | 6/2002 | Moriya ........................ 349/129 |
| 2002/0163457 | A1 | 11/2002 | Azami et al. |
| 2002/0171800 | A1 | 11/2002 | Miyazaki et al. |
| 2003/0057419 | A1 | 3/2003 | Murakami et al. |
| 2004/0084673 | A1 | 5/2004 | Hirakata et al. |
| 2004/0218112 | A1 | 11/2004 | Hirakata et al. |
| 2004/0233370 | A1 | 11/2004 | Jinno et al. |
| 2009/0072235 | A1 | 3/2009 | Zhang et al. |
| 2009/0322698 | A1 | 12/2009 | Hirakata et al. |
| 2012/0105788 | A1 | 5/2012 | Zhang et al. |
| 2012/0120336 | A1 | 5/2012 | Hirakata et al. |
| 2014/0125936 | A1 | 5/2014 | Zhang et al. |

FOREIGN PATENT DOCUMENTS

| | | |
|---|---|---|
| EP | 0 634 685 A2 | 1/1995 |
| EP | 0 649 046 A2 | 4/1995 |
| EP | 0689085 A | 12/1995 |
| EP | 0 725 303 A1 | 8/1996 |
| EP | 0 807 918 A1 | 11/1997 |
| EP | 0 978 877 | 2/2000 |
| EP | 0 984 492 | 3/2000 |
| EP | 1 006 664 | 6/2000 |
| EP | 1 041 622 | 10/2000 |
| JP | 61-184518 | 8/1986 |
| JP | 02-091616 | 3/1990 |
| JP | 04-093924 | 3/1992 |
| JP | 04-127128 A | 4/1992 |
| JP | 05-158053 A | 6/1993 |
| JP | 05158052 A * | 6/1993 |
| JP | 5-281558 | 10/1993 |
| JP | 05-289109 | 11/1993 |
| JP | 06-018903 | 1/1994 |
| JP | 06-051319 | 2/1994 |
| JP | 6-51319 | 2/1994 |
| JP | 6-59228 | 3/1994 |
| JP | 06-138484 | 5/1994 |
| JP | 06-230349 | 8/1994 |
| JP | 06-232059 | 8/1994 |
| JP | 6-244104 | 9/1994 |
| JP | 6-265912 | 9/1994 |
| JP | 06-273735 | 9/1994 |
| JP | 07-084267 | 3/1995 |
| JP | 07-120730 | 5/1995 |
| JP | 7-130652 | 5/1995 |
| JP | 07-181488 | 7/1995 |
| JP | 07-287219 | 10/1995 |
| JP | 07-321339 | 12/1995 |
| JP | 07-333655 | 12/1995 |
| JP | 08-006053 | 1/1996 |
| JP | 08-006071 A | 1/1996 |
| JP | 08-008181 | 1/1996 |
| JP | 08-213317 | 8/1996 |
| JP | 08-234225 A | 9/1996 |
| JP | 8-248427 | 9/1996 |
| JP | 08-248436 A | 9/1996 |
| JP | 08-254682 | 10/1996 |
| JP | 09-026603 | 1/1997 |
| JP | 09-073088 | 3/1997 |
| JP | 9-073093 | 3/1997 |
| JP | 09-120062 | 5/1997 |
| JP | 09-120075 A | 5/1997 |
| JP | 09-153619 A | 6/1997 |
| JP | 09-162416 | 6/1997 |
| JP | 09-171196 A | 6/1997 |
| JP | 9-197413 | 7/1997 |
| JP | 10-010544 A | 1/1998 |
| JP | 10-062789 | 3/1998 |
| JP | 10-062817 | 3/1998 |
| JP | 10-068955 | 3/1998 |
| JP | 10-068956 A | 3/1998 |
| JP | 63-050817 | 3/1998 |
| JP | 10-96955 | 4/1998 |
| JP | 10-104418 | 4/1998 |
| JP | 10-111515 A | 4/1998 |
| JP | 10090689 A * | 4/1998 |
| JP | 10-153785 | 6/1998 |
| JP | 10-153797 | 6/1998 |
| JP | 10-186368 A | 7/1998 |
| JP | 10-206893 | 8/1998 |
| JP | 10-223903 | 8/1998 |
| JP | 10-228022 | 8/1998 |
| JP | 10-247735 | 9/1998 |
| JP | 10-268316 | 10/1998 |
| JP | 10-268316 A | 10/1998 |
| JP | 10-268361 | 10/1998 |
| JP | 10-319440 | 12/1998 |
| JP | 10-325959 | 12/1998 |
| JP | 10-339889 | 12/1998 |
| JP | 11-052396 | 2/1999 |
| JP | 11-064853 | 3/1999 |
| JP | 11-84386 | 3/1999 |
| JP | 11-95194 | 4/1999 |
| JP | 11-095261 | 4/1999 |
| JP | 11-097702 | 4/1999 |
| JP | 11-101986 A | 4/1999 |
| JP | 11-109372 | 4/1999 |
| JP | 11-119230 A | 4/1999 |
| JP | 11-133463 | 5/1999 |
| JP | 11-133600 | 5/1999 |
| JP | 11-153810 A | 6/1999 |
| JP | 2000-122071 | 4/2000 |
| JP | 2000-171805 | 6/2000 |
| JP | 2000-321580 | 11/2000 |
| JP | 2001-075500 | 3/2001 |
| JP | 3708593 | 10/2005 |

OTHER PUBLICATIONS

"Complaint for Patent Infringement, Demand for Jury Trial", *Semiconductor Energy Laboratory Co., Ltd* (Plaintiff) v. *Chi Mei Optoelectronics Corp, et al.* (Defendants), Filed: Mar. 22, 2007.

H. Ohtani et al., "LP-B; Late-News Poster: A 60-in. HDTV Rear-Projector with Continuous-Grain-Silicon Technology", Society for Information Display International Symposium Digest of Technical Papers, vol. XXIX, May 1998, pp. 467-470.

European Search Report for Application No. 00110377.9-1528/; Dated: Oct. 15, 2004.

European Search Report for Application No. 00109971.2-2203-; Dated Aug. 17, 2000.

Ryuichi Shimokawa et al.; "Characteristics of High-Efficiency Cast-Si Solar Cell Wafers by MBIC Measurement"; Japanese Journal of Applied Physics, vol. 27, No. 5, May 1998, pp. 751-758.

Shiroh Inui, et al. "Thresholdless Antiferroelectricity in Liquid Crystals and its Application to Displays"; Journal of Materials Chemistry, vol. 6, No. 4, 1996, pp, 671-673.

Furue et al., "Characteristics and Driving Scheme of Polymer-Stablized Monostable FLCD Exhibiting Fast Response Time and High Contrast Ratio with Gray-Scale Capability", SID 98 Digest, pp. 782-785.

Yoshida et al., "A Full-Color Thresholdless Antiferroelectric LCD Exhibiting Wide Viewing Angle with Fast Response Time", SID 97 Digest, pp. 841-844.

* cited by examiner

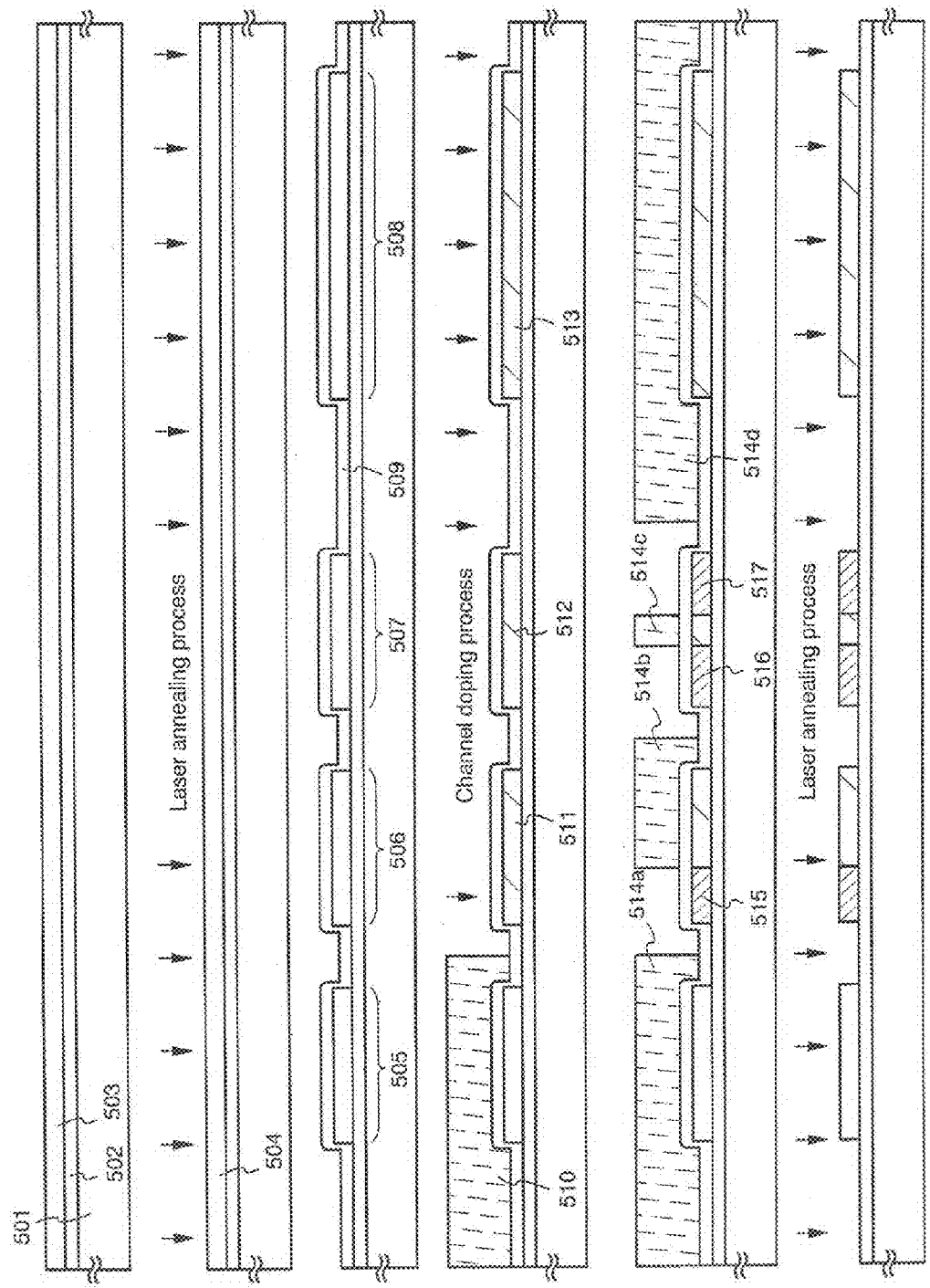

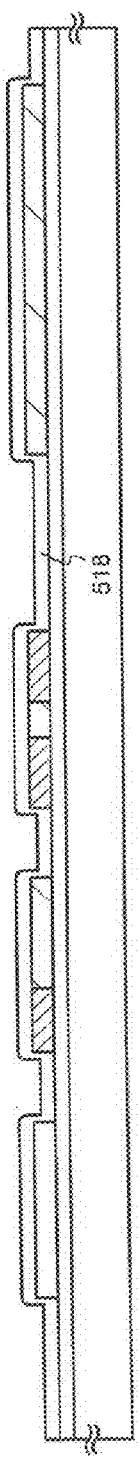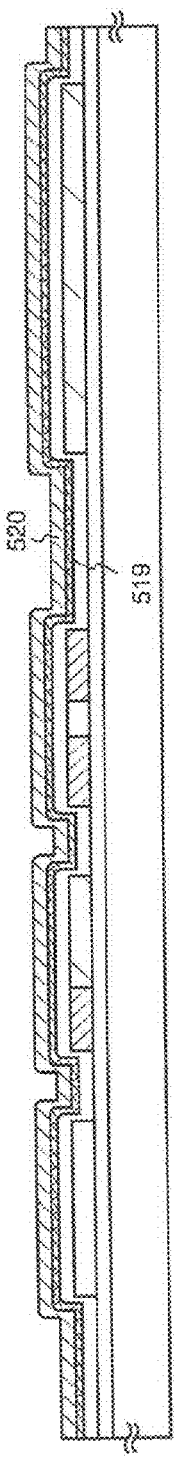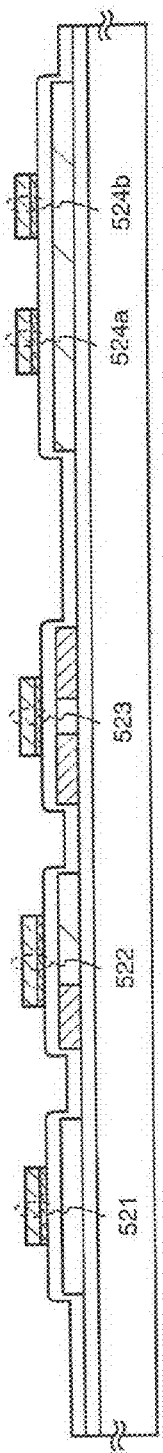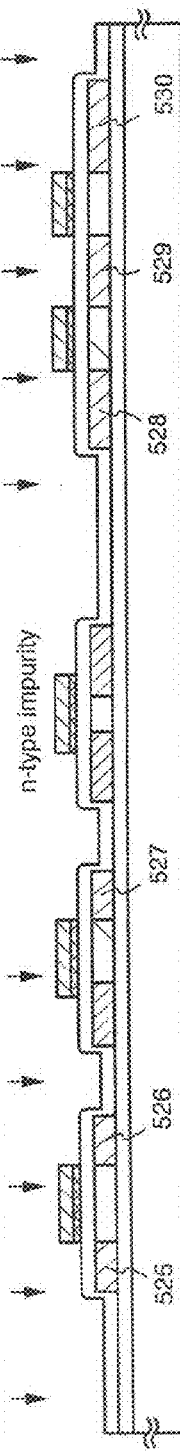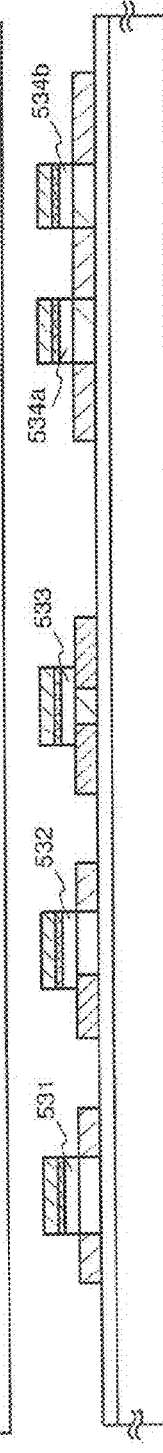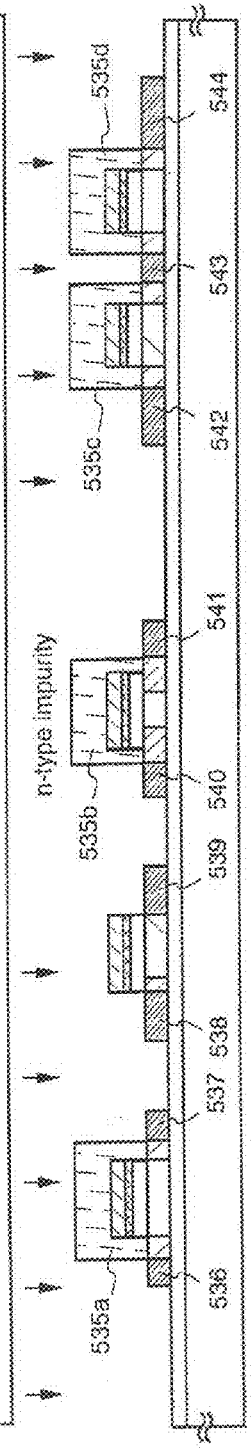

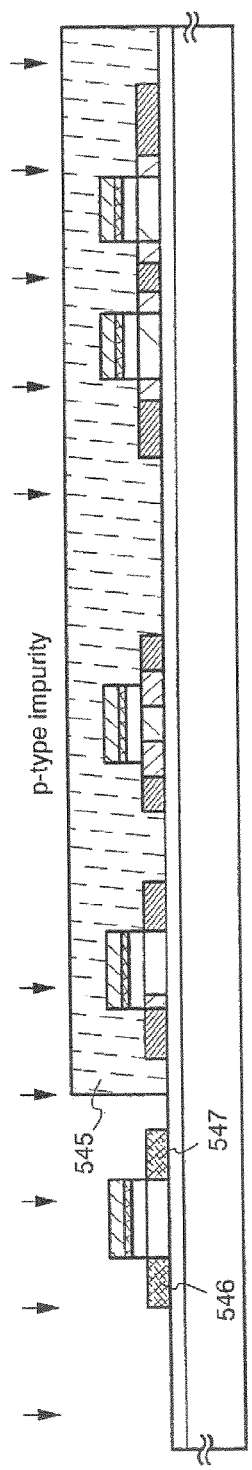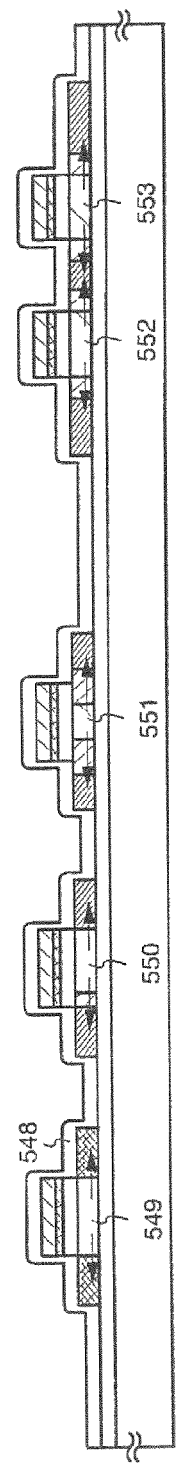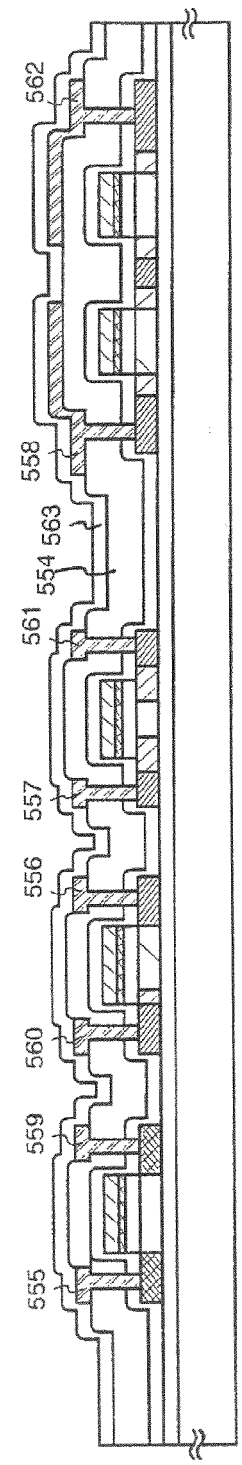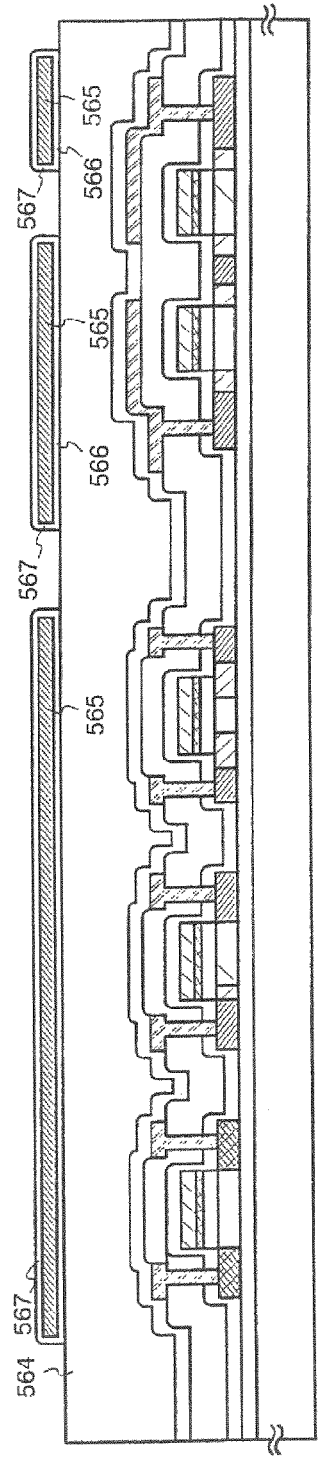

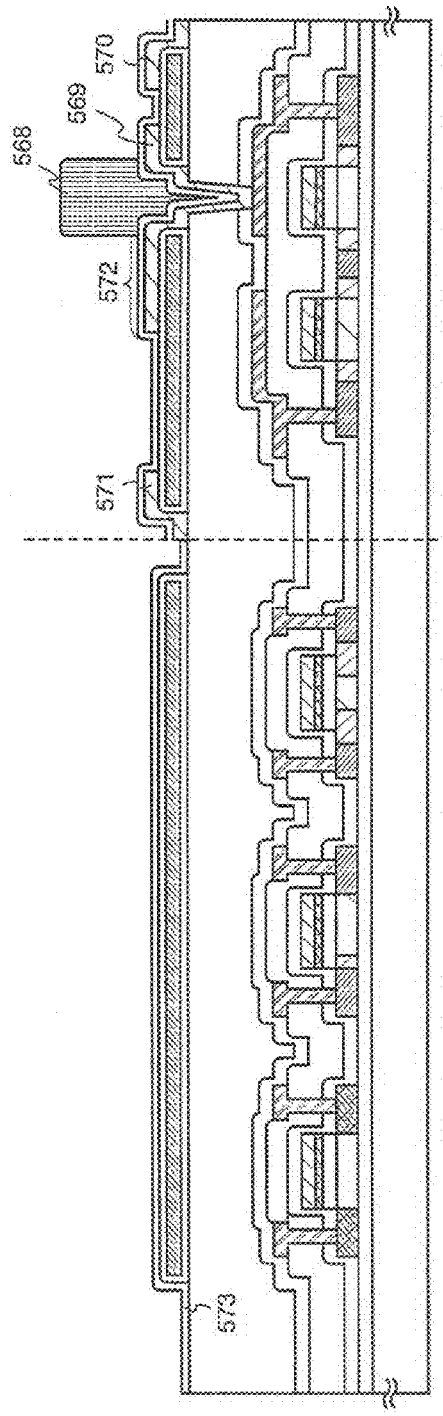
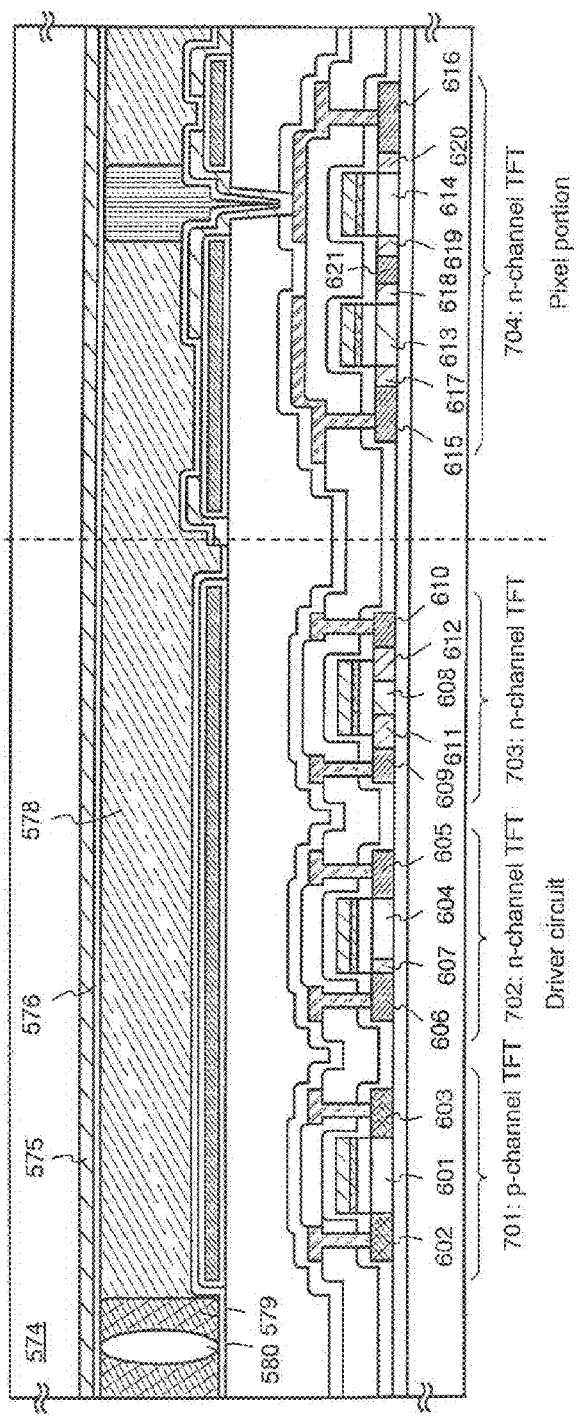
Fig. 8A
Fig. 8B

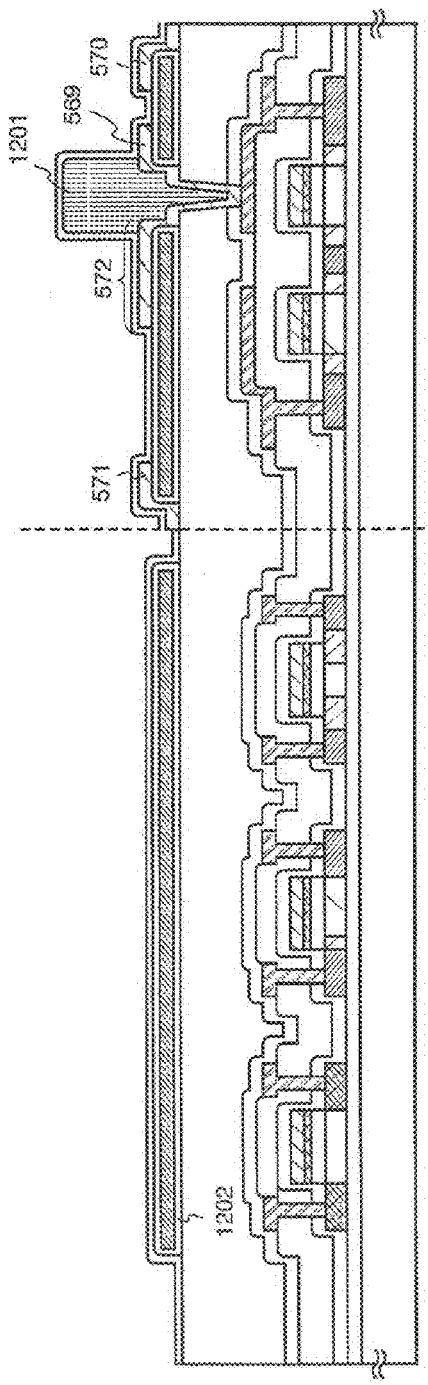
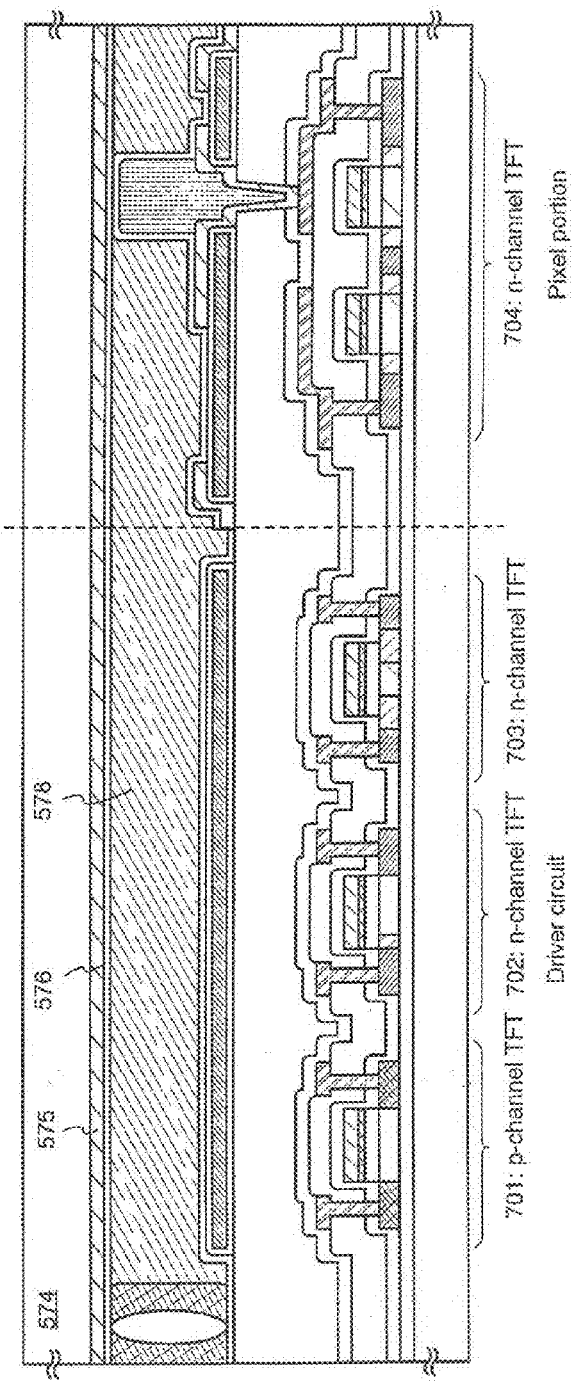
Fig. 16A
Fig. 16B

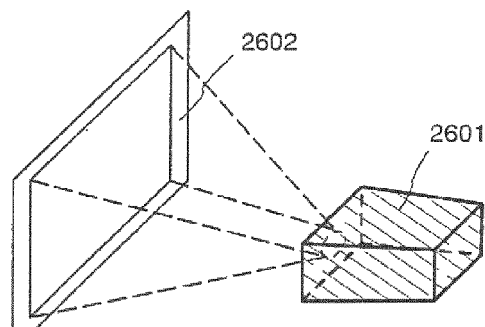
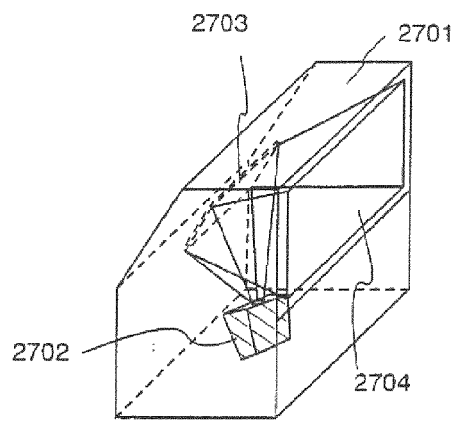
Fig. 26A          Fig. 26B
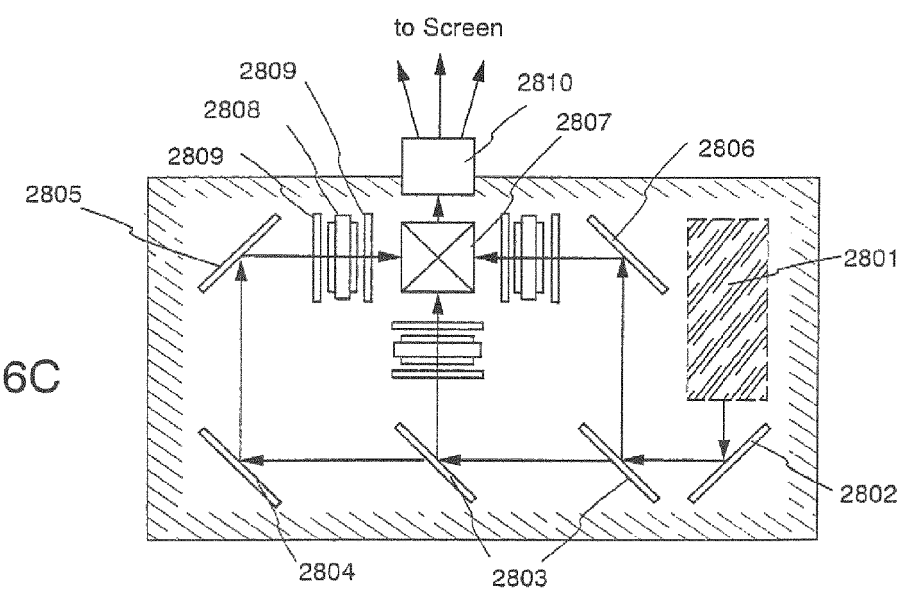
Fig. 26C
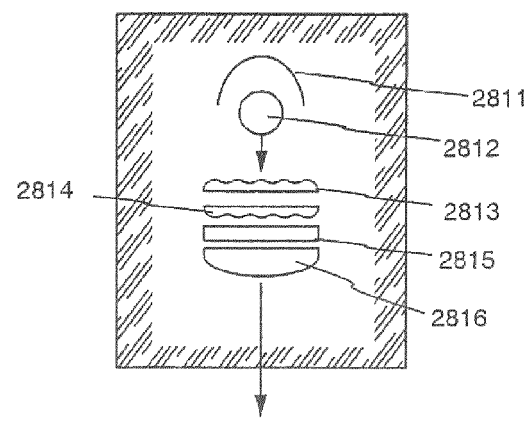
Fig. 26D

SEMICONDUCTOR DEVICE AND METHOD OF FABRICATING THE SAME

BACKGROUND OF THE INVENTION

1. Field of the Invention

The present invention relates to a semiconductor device including a circuit constructed by thin film transistors (hereinafter referred to as TFTs) and a method of fabricating the same. For example, the present invention relates to an electro-optical device typified by a liquid crystal display panel, and an electronic equipment including such an electro-optical device as a part.

Incidentally, in the present specification, the term "semiconductor device" indicates any devices capable of functioning by using semiconductor characteristics, and any of the electro-optical device, semiconductor circuit, and electronic equipment is a semiconductor device.

2. Description of the Related Art

In recent years, attention has been paid to a technique for constructing a thin film transistor (TFT) using a semiconductor thin film (its thickness is about several to several hundred nm) formed on a substrate having an insulating surface. The thin film transistor is widely applied to an electronic device, such as an IC or an electro-optical device, and especially as a switching element of an image display device, its development has been hastened.

As a typical example of the electro-optical device, a liquid crystal display device, an EL display device, or a contact type image sensor can be cited.

In general, the liquid crystal display device includes a pair of substrates which are opposed to each other at a certain substrate interval, particulate spacers for keeping the certain substrate interval, and a liquid crystal material sealed between the substrates.

The substrate interval of the liquid crystal display device is normally set to 1 to 20 μm, and this must be uniformly controlled with accuracy of about ±0.1 μm. This is because if fluctuation occurs in the substrate interval, not only deterioration in display quality, such as generation of irregular color or interference fringe, is caused, but also trouble, such as circuit damage or disabled display, is caused by contact of electrodes when the substrate interval is narrowed by an external force. Like this, the spacer is an important member for maintaining the performance of the liquid crystal display element.

Hereinafter, a conventional method of fabricating a liquid crystal display device (TFT-LCD) will be described in brief.

First, a pair of substrates are prepared. TFT elements and pixel electrodes are formed in matrix form on one of the substrates. Electrodes, color filters or the like are formed on the other substrate. Next, after an alignment film is formed on each of the pair of substrates, a rubbing processing is performed.

Next, particulate spacers are uniformly sprayed on the alignment film of either one of the substrates. Next, the one substrate is combined with the other substrate, and their peripheral portions are sealed with an adhesive for sealing, so that a liquid crystal cell is formed. Next, after the liquid crystal cell is filled with a liquid crystal material by a vacuum injection method, an injection port is sealed.

The foregoing flow of steps is a general fabricating process of a TFT-LCD.

In the above conventional steps, it is difficult to uniformly spray the particulate spacers, and there have been problems that transmissivity is lowered by aggregation of the spacers, and an element just under the spacer is destroyed to generate a leak or short circuit.

Besides, in the step of injecting the liquid crystal material by the vacuum injection method, center portions of the substrates become recess-shaped at both surfaces by pressurization at the time of injection, and in this periphery, the conventional particulate spacer does not have sufficient compression strength and is destroyed, or the spacer is moved and the trace of the movement causes orientation defects.

In the case where the generally used conventional particulate spacers (glass beads, plastic beads, etc.) are used, there is adopted a method of spraying the particulate spacers onto one of substrates. Thus, the spacers are disposed on a pixel electrode, and block incident light or disturb the orientation of liquid crystal molecules. As a result, it has been difficult to adjust the transmitted light amount or coloring. Besides, the particulate spacers are easily charged with static electricity, so that the spacers become easily aggregate and are difficult to be uniformly distributed.

SUMMARY OF THE INVENTION

An object of the present invention is to provide a high quality liquid crystal panel having a thickness with high accuracy, which is designed, without using particulate spacers, within a free range in accordance with characteristics of a used liquid crystal and a driving method, and is also to provide a method of fabricating the same.

According to an aspect of the present invention, a semiconductor device includes a first substrate, a second substrate, and a plurality of columnar spacers disposed between the first substrate and the second substrate and maintaining an interval between the first substrate and the second substrate.

Besides, according to another aspect of the present invention, a semiconductor device includes a first substrate, a second substrate, and a plurality of columnar spacers disposed between the first substrate and the second substrate, wherein a radius R of curvature of each of the columnar spacers is 2 μm or less, preferably 1 μm or less.

Besides, in the foregoing respective structures, a height H of each of the columnar spacers is 0.5 μm to 10 μm, preferably 1.2 μm to 5 μm.

Besides, in the foregoing respective structures, a width L1 of each of the columnar spacers is 20 μm or less, preferably 7 μm or less.

Besides, in the foregoing respective structures, an angle α between a tangent plane at a center of a side of each of the columnar spacers and a substrate surface is 65° to 115°.

Besides, in the foregoing respective structures, each of the columnar spacers includes a flat surface at its top portion.

Besides, in the foregoing respective structures, a sectional shape of each of the columnar spacers in a radial direction is a circle, an ellipse, a triangle, a quadrilateral, or a polygon having sides more than the former.

Besides, in the foregoing respective structures, each of the columnar spacers is made of an insulating material.

Besides, in the foregoing respective structures, each of the columnar spacers is formed over a contact portion where a TFT and a pixel electrode are connected to each other.

Besides, the columnar spacers may be formed only at a sealing region, or may be formed at a sealing region and a region of a driver circuit where an element does not exist. Besides, the columnar spacers may be formed at the sealing region and a pixel portion, or may be formed at a region of the driver circuit where an element does not exist and the pixel portion. Besides, the columnar spacers may be formed at the sealing region and a region between the driver circuit and the pixel portion, or the columnar spacers may be formed at a region between the driver circuit and the pixel portion, and the pixel portion.

Besides, the columnar spacers may be formed at a sealing region, over a region of a driver circuit where an element does not exist, and at a pixel portion, or the columnar spacers may be formed over a region of the driver circuit where an element does not exist and at a region between the driver circuit and the pixel portion. Besides, the columnar spacers may be formed at the sealing region, over a region of the driver circuit where an element does not exist, at a region between the driver circuit and the pixel portion, and the pixel portion, or the columnar spacers may be formed at a region between the sealing region and the pixel portion. Besides, the columnar spacers may be formed at a region between the sealing region and the driver circuit, or the columnar spacers may be formed at a region between the sealing region and an end portion of the substrate. Besides, the columnar spacers may be formed at all regions of the substrate.

Besides, in the foregoing respective structures, in the case where the columnar spacers are formed to be in contact with an alignment film, a pretilt angle of liquid crystal is 4° to 5°.

Besides, in the foregoing respective structures, in the case where the columnar spacers are covered with an alignment film, a pretilt angle of liquid crystal is 6° to 10°.

Besides, according to another aspect of the present invention, a semiconductor device includes a display device equipped with a first substrate, a second substrate, and a plurality of columnar spacers disposed between the first substrate and the second substrate, and a touch panel equipped with an optical detecting element.

Besides, according to another aspect of the present invention, a semiconductor device includes a display device equipped with a first substrate, a second substrate, and a plurality of columnar spacers disposed between the first substrate and the second substrate, and a touch panel equipped with a pressure sensitive type detecting element.

Besides, according to another aspect of the present invention, a semiconductor device includes a display device equipped with a first substrate, a second substrate, and a plurality of columnar spacers disposed between the first substrate and the second substrate, a and a touch panel equipped with a capacitive type detecting element.

Besides, according to another aspect of the present invention, a method of fabricating a semiconductor device comprises a first step of forming a TFT on a substrate, a second step of forming a flattening film to cover the TFT, a third step of forming an opening in the flattening film to reach to the TFT and forming a pixel electrode, a fourth step of forming an alignment film on the pixel electrode, a fifth step of performing a rubbing processing on the alignment film, and a sixth step of forming a columnar spacer made of an insulating film over a contact portion where the TFT is connected to the pixel electrode.

Besides, according to another aspect of the present invention, a method of fabricating a semiconductor device comprises a first step of forming a TFT on a substrate, a second step of forming a flattening film to cover the TFT, a third step of forming an opening in the flattening film to reach to the TFT and forming a pixel electrode, a fourth step of forming a columnar spacer made of an insulating film over a contact portion where the TFT is connected to the pixel electrode, a fifth step of forming an alignment film to cover the pixel electrode and the columnar spacer, and a sixth step of performing a rubbing processing on the alignment film.

In the foregoing structure, the step of forming the columnar spacer made of the insulating film includes a step of forming the insulating film and a step of patterning the insulating film so that the columnar spacer is formed.

BRIEF DESCRIPTION OF THE DRAWINGS

FIGS. 5A to 5F are views showing fabricating steps of an AM-LCD.

FIGS. 6A to 6F are views showing fabricating steps of the AM-LCD.

FIGS. 7A to 7D are views showing fabricating steps of the AM-LCD.

FIGS. 8A and 8B are views showing fabricating steps of the AM-LCD.

FIGS. 16A and 16B are views showing fabricating steps of an AM-LCD.

FIGS. 26A to 26D are views showing examples of electronic devices.

DESCRIPTION OF THE PREFERRED EMBODIMENTS

A mode of carrying out the present invention will be described below with reference to FIGS. 1 to 4.

In the present invention, a columnar spacer is used to keep an interval between a first substrate and a second substrate constant. It is desirable that the shape of the columnar spacer of the present invention satisfies conditions described below.

Figure 1A:
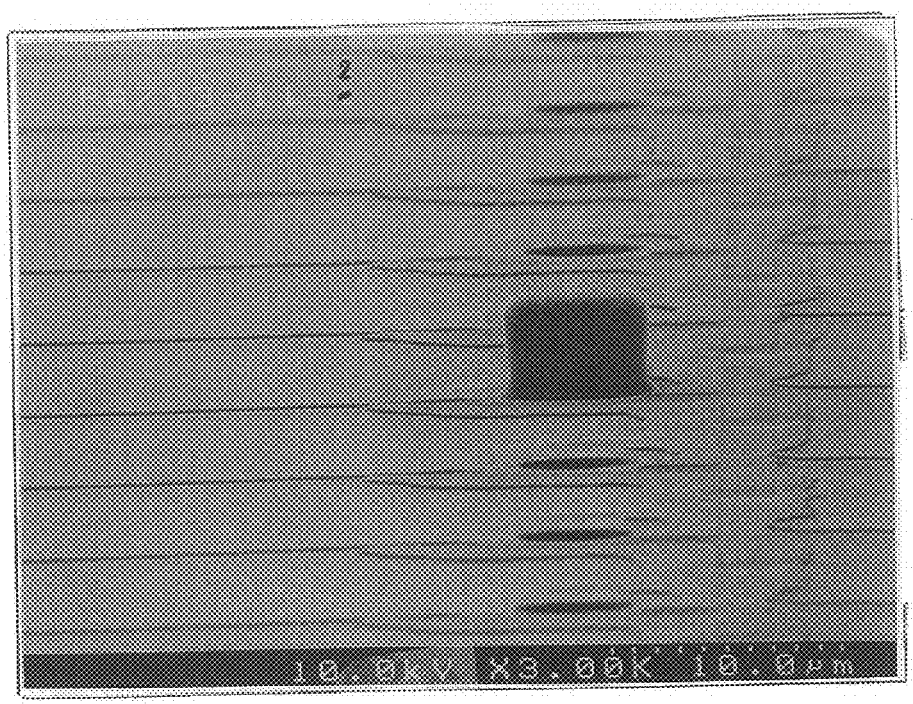
FIGS. 1A and 1B are a SEM observation photograph of a columnar spacer of the present invention and its schematic view.
Figure 1B:
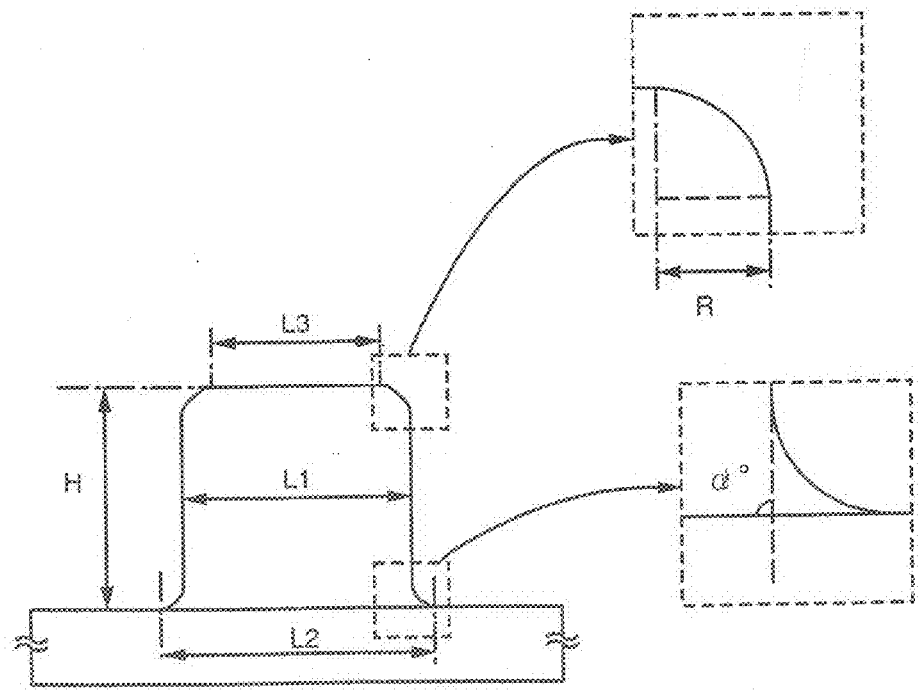

As shown in FIG. 1B, in the columnar spacer, it is assumed that the width (diameter) of a center portion is L1, the width (diameter) of an upper end is L3, and the width (diameter) of a lower end is L2. In steps shown in FIGS. 3A to 3E (in the case where a columnar spacer 303 is formed on an alignment film 301), values of widths of the columnar spacer itself are made the widths L1 to L3. However, in steps shown in FIGS. 14A to 14E (in the case where an alignment film 1103 is formed on a columnar spacer 1102), values obtained by adding the thickness of the alignment film to the columnar spacer itself are made the widths L1 to L3. Incidentally, the width L2 is a width of a region where there exists a columnar spacer material having a thickness of 0.2 μm or more from a plane prior to formation of the columnar spacer. It is necessary that the width L1 of the center of the columnar spacer functions satisfactorily as a spacer, and it is desirable that the width is 20 μm or less, preferably 10 μm or less, more preferably 7 μm or less.

Incidentally, in the present specification, the lower end indicates an end portion of a columnar spacer at a first substrate side. The upper end indicates a top portion of the columnar spacer. The top portion of the columnar spacer of the present invention has a that surface so that when an external force is applied, a uniform pressure is applied to the columnar spacer. Since a spacer made of resin has excellent elasticity, it can suitably absorb the pressure. Besides, differently from a particulate spacer, the columnar spacer of the present invention comes in contact with an element through a surface, so that the pressure is dispersed, and there does not occur a case where an excessive pressure is applied to one point. The present invention is devised such that the radius R of curvature of an end portion at the top portion of the columnar spacer is made 2 μm or less, preferably 1 μm or less, so that a uniform pressure is applied to the columnar spacer.

In the present invention, it is preferable that the widths of the respective portions of the columnar spacer are the same, that is, L1=L2=L3. Besides, it is preferable that an angle α between the side of the columnar spacer at the center and the substrate surface is made a value within the range of 65° to 115°.

However, in the case where the columnar spacer is actually formed, the upper end of the columnar spacer becomes an end portion having the radius of curvature of 2 μm or less, preferably 1 μm or less, and a taper portion is formed at the lower end of the columnar spacer, so that the relation between the widths becomes L2>L1>L3. At the taper portion, defective orientation in a liquid crystal is apt to occur, and light leakage occurs around this. In the present invention, the widths are set in the range of 0.8≤L2/L1≤3, so that the light leakage is reduced. Incidentally, in the steps shown in FIGS. 3A to 3E (in the case where the columnar spacer is formed on the alignment film), it is desirable to establish the relation of 1≤L2/L1≤1.1. Besides, in the steps shown in FIGS. 14A to 14E (in the case where the alignment film is formed on the columnar spacer), it is desirable to establish the relation of 1≤L2/L1≤2.5.

Since a contact area to a second substrate is reduced, when an outer pressure is applied, a large pressure is locally applied. This causes deterioration of spacer strength. In the present invention, the relation of 0.6≤L3/L1≤1.2 is established, so that the spacer strength is strengthened.

Since the height H of the columnar spacer can be controlled within a free range through the conditions of forming steps of the columnar spacer, it may be suitably set to a desired value. For example, in a liquid crystal display device, according to a liquid crystal material (TN liquid crystal, ferroelectric liquid crystal, antiferroelectric liquid crystal, etc.) used for the device, the height is set to an optimum substrate interval (0.5 μm to 10 μm, preferably 1.2 μm to 5 μm).

As a material of the columnar spacer, an insulating material (insulating film) made of a resin material is desirable. An insulating film made of a resin material such as polyimide can be formed by applying a solution, and an insulating film made by solution application is very suitable for filling minute holes. Of course, a silicon oxide film or the like formed by applying a solution may be used. In the case where an insulating film made of a resin material is used, a photopolymerization type insulating film may be used, or a thermal polymerization type insulating film may be used. Especially when a positive or negative photosensitive resin is used, the columnar spacer can be formed through a simple step, so that it is preferable. Besides, in order to avoid photodeterioration, it is desirable to use a resin material having negative photosensitivity.

A sectional shape of the columnar spacer in the radial direction may be a circle or an ellipse. Besides, the shape may be a triangle, a quadrilateral, or a polygon having sides more than the former.

Figure 2A:
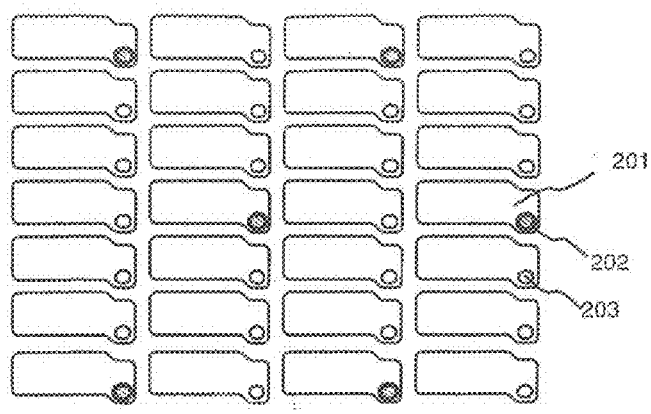
FIGS. 2A to 2C are views showing examples of arrangement of columnar spacers and SEM observation photographs.

As shown in FIG. 2A, the columnar spacers are disposed regularly. In FIG. 2A, although such a structure is adopted that one columnar spacer 202 is disposed for every 6 pixels (6 rows×1 column), the invention is not particularly limited, and the columnar spacers have only to be disposed at a density of 10 to 200 ones per mm$^2$. In FIG. 2A, reference numeral 201 designates a pixel electrode; and 203, a contact portion where a columnar spacer is not formed. In FIG. 2A, although the columnar spacer is formed at a position over the contact portion where the TFT and the pixel electrode are connected to each other, the position of the columnar spacer is not particularly limited. For example, if it is formed over a wiring (source wiring, gate wiring, capacitance wiring, etc.) or over a light-shielding film, it does not influence transmissivity, so that such a position is preferable. Besides, the columnar spacer may be formed at a region other than the pixel portion, for example, a region of a driver circuit where an element does not exist, a sealing region, a region between the pixel portion and the driver circuit, a region between the pixel portion and the sealing region, a region between the driver circuit and the sealing region, or a region between the sealing region and an end portion of a substrate. Incidentally, when the columnar spacer is formed at the region between the sealing region and the end portion of the substrate, since pressure is uniformly applied in a bonding step and a substrate cutting step, the yield is improved. If a columnar spacer is formed over a wiring extending from an end portion for connection with an FPC to the driver circuit, the mechanical strength of a portion connecting with the FPC can be reinforced.

Figure 3A:
FIGS. 3A to 3E are views showing fabricating steps of the present invention.
Figure 3B:
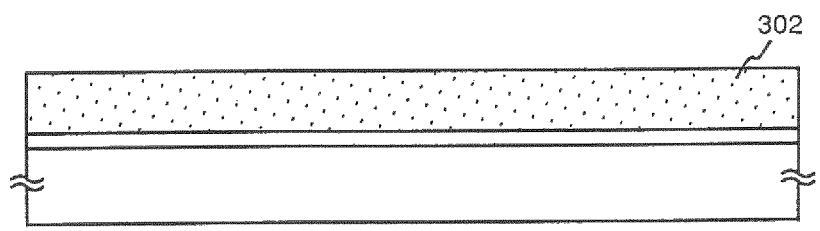
Figure 3C:
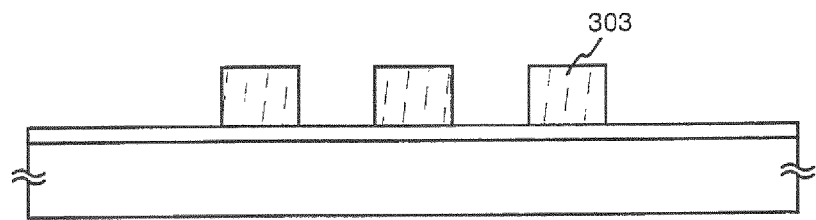
Figure 3D:
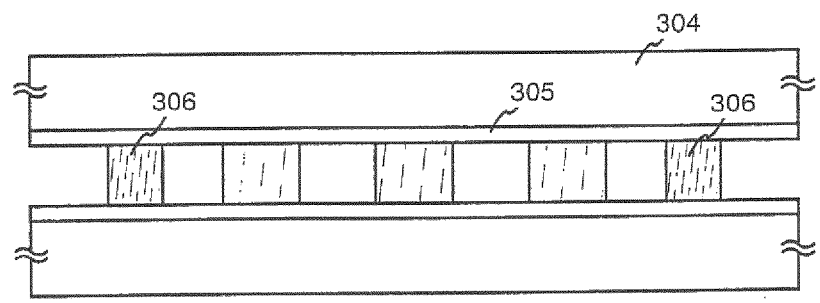
Figure 3E:
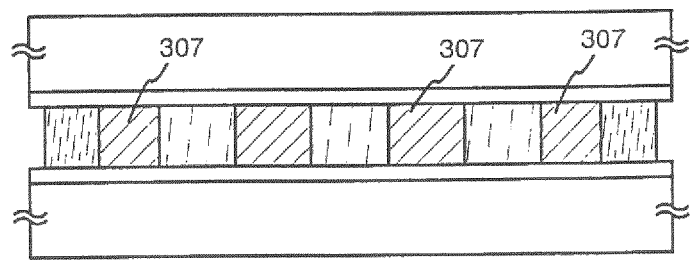
Figure 4:
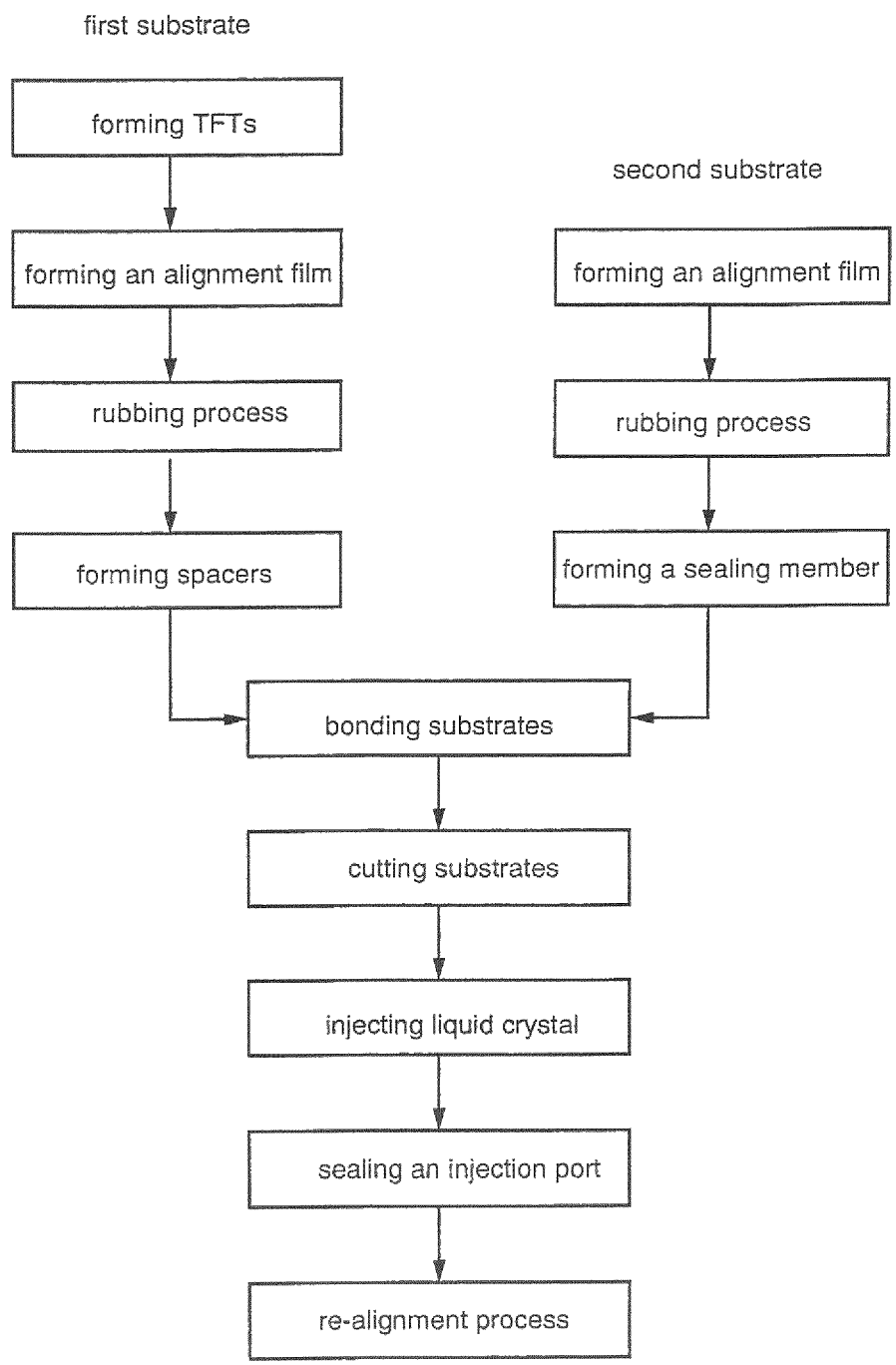
FIG. 4 is a view showing a flowchart of fabricating steps of the present invention.

A fabricating method using the columnar spacer of the present invention having the foregoing shape will be described below in brief FIGS. 3A to 3E are sectional views showing steps of the present invention, and FIG. 4 is a flowchart showing the sequence of steps.

First, a first substrate 300 on which switching elements and pixel electrodes are formed in matrix form, is prepared. Besides, a second substrate 304 on which electrodes are formed, is prepared. Incidentally, in FIG. 3, for simplicity, the switching elements, the pixel electrodes and the like are not shown. Next, after alignment films 301 and 305 are formed on the first substrate 300 and the second substrate 304, respectively, a rubbing processing is performed (FIG. 3A).

Next, a spacer material layer 302 is formed on the alignment film 301 of the first substrate (FIG. 3B). Here, although an example in which a columnar spacer is formed on the first substrate is described, a step of forming the columnar spacer on the second substrate may be adopted.

After a pattern of columnar spacers is exposed to the thus formed spacer material layer 302 through a mask for exposure, a development processing is performed and columnar spacers 303 are formed (FIG. 3C).

Then a sealing material pattern 306 is formed on the second substrate 304 on which the electrodes and the alignment film 305 are formed. In the sealing material pattern, a pattern frame of forming a liquid crystal injection port, having a rectangle shape and the same width, is formed. Here, although there is shown an example in which a sealing region is formed on the second substrate, a step of forming a sealing region on the first substrate may be adopted. Then the first substrate 300 is bonded to the second substrate 304. A bonding step is a step in which after the substrates are bonded to each other with high accuracy by using an alignment mark, a sealing material is hardened by pressurizing and firing (FIG. 3D).

Thereafter, the first substrate and the second substrate are cut into a suitable size, and after a liquid crystal material 307 is injected from the liquid crystal injection port, the injection port is sealed. In this way, a liquid crystal panel is completed.

In the foregoing steps, there is shown an example in which after the alignment film is formed on the first substrate, the columnar spacer is formed thereon. However, as shown in FIGS. 14A to 14E, such a step may be adopted that after a columnar spacer 1102 is formed on a first substrate 1100, an alignment film 1103 is formed thereon.

Besides, such a step may be adopted that a color filter or a shielding film is formed on the first substrate or the second substrate.

Besides, here, although an example of an active matrix type liquid crystal display device is shown, the invention is not particularly limited. For example, the invention can also be applied to a simple matrix type liquid crystal display device, and a display system may be of a TN type or STN type, or a transmission type or reflection type.

The present invention made of the foregoing structure will be described in more detail with embodiments described below.

DETAILED DESCRIPTION OF THE PREFERRED EMBODIMENTS

[Embodiment 1]

An embodiment according to the present invention is described by using FIGS. 5A to 8B. A method for fabricating a pixel section and a driver circuit provided in its peripheral at the same time, is described here. Note that a CMOS circuit which is a basic circuit for a shift register and buffer circuit etc., and an n-channel TFT forming a sampling circuit are shown for the driver circuit for the simplicity of explanation.

In FIG. 5A, it is preferable to use a glass substrate or a quartz substrate for substrate 501. Other than those, a silicon substrate, a metal substrate or a stainless steel substrate having an insulating film formed on the surface thereof may be used. If heat resistivity permits, it is also possible to use a plastic substrate.

A base film 502 which comprises an insulating film comprising silicon ("an insulating film comprising silicon" generically represents a silicon oxide film, a silicon nitride film or a silicon oxynitride film in the present Specification) is formed by plasma CVD or sputtering to a thickness of 100 to 400 nm on a surface of the substrate 501 on which the TFTs are to be fabricated.

Through the Specification silicon oxynitride film is an insulating film represented by SiOxNy and denotes an insulating film which comprises silicon, oxygen and nitrogen at a prescribed proportion. In the present Embodiment a laminate film of a silicon oxynitride film of 100 nm thickness which contains nitrogen at 20 to 50 atomic % (typically 20 to 30 atomic %) and a silicon oxynitride film of 200 nm thickness which contains nitrogen at 1 to 20 atomic % (typically 5 to 10 atomic %) is used as the base film 502. Note that the thickness need not be limited to these values. The proportion of nitrogen and oxygen contained (atomic % proportion) in the silicon oxynitride film may be 3:1 to 1:3 (typically 1:1). Note that the silicon oxynitride film may be fabricated by using $SiH_4$, $N_2O$ and $NH_3$ as raw material gases.

The base film 502 is disposed in order to prevent impurity contamination from the substrate and may not be necessarily disposed in case of using a quartz substrate.

A semiconductor film containing amorphous structure (amorphous silicon film in the present embodiment (not shown)) is formed on the base film 502 to a thickness of 30 to 120 nm (preferably 50 to 70 nm) by a known film deposition method. As a semiconductor film containing amorphous structure, there are amorphous semiconductor film and microcrystalline semiconductor film. Further, a compound semiconductor film containing amorphous structure such as amorphous silicon germanium film etc. may also be included. When the film was formed into the above stated thickness, the thickness of the active layer at the point of finally completing the TFT becomes 10 to 100 nm (preferably 30 to 50 nm).

A semiconductor film containing crystalline structure (crystalline silicon film in embodiment 1) 503 is formed according to a technique disclosed in the Japanese Patent Application Laid-Open No. Hei 7-130652 (corresponding to U.S. Pat. No. 5,643,826). The technique described in the gazette is a crystallization means that uses a catalytic element for promoting crystallization (one or plural of element selected from nickel, cobalt, germanium, tin, lead, palladium, iron and copper; typically nickel) in crystallizing the amorphous silicon film.

More concretely, heat-treatment is conducted under the condition where the catalytic element(s) is held on the surface of the amorphous silicon film to convert the amorphous silicon film to the crystalline silicon film. Although the present Embodiment uses a technique described in the Embodiment 1 of the gazette, a technique described in Embodiment 2 may also be used. Though single crystal silicon film and polycrystalline silicon film are both included in crystalline silicon film, the crystalline silicon film formed in the present embodiment is a silicon film having crystal grain boundaries. (FIG. 5A)

Though it depends on hydrogen content in the amorphous silicon film, it is preferable to carry out dehydrogenating process by heating at 400 to 550° C. for some hours to reduce the contained hydrogen amount at 5 atom % or lower and conduct crystallization process. The amorphous silicon film may be fabricated by other deposition methods such as sputtering or evaporation, but it is preferable to sufficiently reduce impurity elements such as oxygen or nitrogen contained in the film.

Because the base film and the amorphous silicon film can be fabricated by the same deposition method, they may be successively formed. It becomes possible to prevent contamination of the surface by not exposing to the atmosphere after formation of the base film, so that scattering in the characteristics of the fabricated TFTs can be reduced.

Next, a light generated from a laser light source (laser light) is irradiated onto the crystalline silicon film 503 (hereinafter referred to as laser annealing) and a crystalline silicon film 504 in which crystallinity is improved is formed. Though a pulse oscillation type or a continuous oscillation type excimer laser light is preferable for the laser light, a continuous oscillation type argon laser light may also be used as the laser light. The beam shape of the laser light may be linear, or it may be a rectangular shape. (FIG. 5B)

In place of laser light, a light generated from a lamp (hereinafter referred to as lamp radiation) may be irradiated (hereinafter referred to as lamp annealing). As a lamp radiation, lamp radiation generated from for instance halogen lamp or infrared lamp can be a used.

Note that a process for performing heat treatment (annealing) by laser light or lamp light as described here is referred to as a light annealing process. Because light annealing process can perform high temperature heat treatment in a short time, an effective heat treatment process can be performed at high throughput even in case of using a substrate that has a low heat resistance such as a glass substrate etc. Needless to say, they may be replaced by a furnace annealing using electric furnace (also referred to as thermal annealing) since the object is annealing.

In the present Embodiment, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 250 to 500 mJ/cm$^2$ (typically 350 to 400 mJ/cm$^2$).

Laser annealing process carried out at the above stated conditions has an effect of completely crystallizing the amorphous region remained after heat crystallization as well as reducing defects in the crystalline region already crystallized. Accordingly, the present process may be called a process for improving crystallinity of the semiconductor film by light annealing, or a process for promoting crystallization of the semiconductor film. It is also possible to obtain such effect by optimizing the conditions of lamp annealing. In the present Specification such condition is referred to as the first light annealing condition.

Island semiconductor films (hereinafter referred to as active layers) 505 to 508 are next formed by patterning the crystalline silicon film 504. Note that alignment markers used for adjusting the position in the later patterning are formed at the same time by using crystalline silicon film. In the present Embodiment time required for separately forming alignment markers (increase in the number of masks) can be saved because alignment markers can be formed at the same time with the formation of active layers.

Next a protection film 509 is next formed over the active layers 505 to 508 for later impurity doping. The protection film 509 uses a silicon oxynitride film or a silicon oxide film of 100 to 200 nm (preferably 130 to 170 nm) thickness. This protection film 509 has a meaning of not exposing the crystalline silicon film directly to plasma in impurity doping, and enabling trace concentration control. (FIG. 5C)

Then, a resist mask 510 is formed thereon, and impurity element imparting p-type (hereinafter referred to as p-type impurity element) is doped through protection film 509. As a p-type impurity element, typically an element which belongs to group 13 of periodic table, more specifically, boron or gallium can be used. This process (referred to as channel doping process) is a process for controlling threshold voltage of a TFT. Here, boron is doped by ion doping in which diborane ($B_2H_6$) is excited by plasma without mass separation. Needless to say, it is acceptable to use ion implantation in which mass separation is performed.

By this process, active layers 511 to 513 added with p-type impurity element boron in this Embodiment) at a concentration of $1\times10^{15}$ to $1\times10^{18}$ atoms/cm$^3$ (typically $5\times10^{16}$ to $5\times10^{17}$ atoms/cm$^{-3}$) are formed. These active layers 511 to 513 will later become active layers for n-channel TFTS. Note that the concentrations stated in the present Specification are measured values by SIMS (secondary ion mass spectroscopy).

Note that through the specification, an impurity region containing p-type impurity region at least in the above stated concentration range is defined as a p-type impurity region (b) (however, regions where impurity elements imparting n-type typically phosphorus or arsenic are doped at a concentration of $1\times10^{16}$ atoms/cm$^3$ are excluded). (FIG. 5D)

Resist mask 510 is next removed and new resist masks 514a to 514d are formed. Then impurity regions imparting n-type 515 to 517 are formed by doping impurity element imparting n-type (hereinafter referred to as n-type impurity element). As an n-type impurity element, typically an element belonging to group 15, more specifically, phosphorus or arsenic can be used. (FIG. 5E)

These low concentration impurity regions 515 to 517 are impurity regions that function as LDD regions in the n-channel TFT of the later formed CMOS circuit and sampling circuit. In thus formed impurity regions, n-type impurity element is contained at a concentration of $2\times10^{16}$ to $5\times10^{19}$ atoms/cm$^3$ (typically $5\times10^{17}$ to $5\times10^{18}$ atoms/cm$^3$). In the present specification, an impurity region containing n-type impurity element in the above stated concentration range is defined as an n-type impurity region (b).

Note that phosphorus is doped here by ion doping to a concentration of $1\times10^{18}$ atoms/cm$^3$ in which phosphine ($PH_3$) is excited by plasma without mass separation. Needless to say, ion implantation in which mass separation is performed may be used as well. In this process, phosphorus is doped into the crystalline silicon film through protecting film 509.

Next, resist masks 514a to 514d and a protecting film 509 are removed, and irradiation process by laser light is conducted again. Here again excimer laser light of pulse oscillation type or continuous oscillation type is preferable as the laser light, but argon laser light of continuous oscillation type may also be used. The beam shape of the laser light may be either of linear or rectangular shape. However, because activation of the doped impurity element is the object, it is preferable to irradiate with an energy at a level of not melting the crystalline silicon film. It is also possible to conduct laser annealing process with the protecting film 509 left thereon. (FIG. 5F)

In the present Embodiment, laser annealing process was carried out by forming pulse oscillation type excimer laser light into a linear shape. The laser annealing conditions are: KrF gas is used as excitation gas, treatment temperature is set at room temperature, pulse oscillation frequency is set at 30 Hz, and laser energy density at 100 to 300 mJ/cm$^2$ (typically 150 to 250 mJ/cm$^2$).

The light annealing process carried out on the above stated conditions has an effect of recrystallizing the semiconductor film that was made into amorphous in impurity element doping as well as activating the impurity element imparting n-type or p-type that was doped. It is preferable that the above stated conditions make atomic arrangement coordinated without melting the semiconductor film and at the same time activate the impurity elements. The present process may be referred to as a process for activating the impurity element imparting n-type or p-type by light annealing, a process for recrystallizing the semiconductor film or a process for simultaneously carrying out both of them. Such effect can be obtained by optimizing the lamp annealing condition as well. In the present specification, this condition is referred to as the second light annealing condition.

By this process, the boundary of n-type impurity regions (b) 515 to 517, that is, the junction area with the intrinsic regions (p-type impurity region (b) is also regarded as substantially intrinsic) that exist around n-type impurity region (b) become clear. This means that LDD region and channel formation region may form a very good junction when later finishing TFT.

On activation of the impurity elements by this laser light, activation by heat treatment which uses an electric furnace may also be combined. In case of conducting activation by heat treatment, heat treatment of approximately 450 to 650° C. (preferably 500 to 550° C.) may be conducted considering the heat resistance of the substrate.

Next, gate insulating film 518 is formed to cover the active layers 505 and 511 to 513. Gate insulating film 518 may be formed into a thickness of 10 to 200 nm, preferably into 50 to 150 nm. In the present embodiment, a silicon oxynitride film is formed into a thickness of 115 nm by plasma CVD with raw materials of $N_2O$ and $SiH_4$. (FIG. 6A)

Then, a conductive film, that will form a gate wiring is formed. Note that the gate wiring may be formed by a single layered conductive film, but it is preferable to form laminated films of double layers, or triple layers as occasion demands. In the present embodiment, laminate comprising a first conductive film 519 and a second conductive film 520, is formed. (FIG. 6B)

As the first conductive film 519 and the second conductive film 520, a metal film comprising an element selected from tantalum (Ta), titanium (Ti), molybdenum (Mo), tungsten (W), chromium (Cr), niobium (Nb), and silicon (Si), a metal compound film composed of these element as its main component (typically tantalum nitride film, tungsten nitride film or titanium nitride film), an alloy film combining these elements (typically Mo—W alloy film, Mo—Ta alloy film, tungsten silicide film) or a laminate film of these thin films can be used.

The first conductive film 519 may be formed into 10 to 50 nm (preferably 20 to 30 nm) and the second conductive film 520 may be formed into 200 to 400 nm (preferably 250 to 350 nm). In the present Embodiment, tantalum nitride (TaN) film of 50 nm thick was used as the first conductive film 519 and tantalum (Ta) film of 350 nm thick was used as the second conductive film 520.

Other than this, a laminate of tungsten nitride film and tungsten film, a single layer of tantalum nitride film and a tungsten silicide film are also appropriate. In addition, when a structure which has a silicon film at a thickness of approximately 2 to 20 nm formed under the first conductive film 519 (polycide structure) is employed, close adhesion of conductive film formed on the silicon film is improved and oxidation of the conductive film can be prevented.

Further, it is effective to nitrificate by exposing the surface into plasma atmosphere using ammonia gas or nitrogen gas, in case of using a metal film for the second conductive film 520 like in embodiment 1. By doing so, it is possible to prevent the oxidation of the surface of the metal film.

Gate wirings (they can also be referred to as gate electrodes) 521 to 524a and 524b are formed into 400 nm thickness by etching the first conductive film 519 and the second conductive film 520 at a time. Gate wirings 522 and 523 that are formed in a driver circuit are farmed to overlap a portion of n-type impurity region (b) 515 to 517 by interposing a gate insulating film. Note that the gate wirings 524a and 524b seem to be two electrodes in the cross sectional view, but in effect they are formed of one continuing pattern. (FIG. 6C)

Ten, n-type impurity element (phosphorus in the present Embodiment) is doped in a self-aligned manner using gate electrodes 521 to 524b as masks. The concentration of phosphorus doped into thus formed impurity regions 525 to 530 are set at a concentration of ½ to ⅒ (specifically ⅓ to ¼) of the above stated n-type impurity region (b) (provided it is higher by 5 to 10 times than boron concentration added in the channel doping process, specifically $1\times10^{16}$ to $5\times10^{18}$ atoms/$cm^3$, typically $3\times10^{17}$ to $3\times10^{18}$ atoms/$cm^3$). In the present Specification, an impurity region containing n-type impurity element at the above stated concentration range is defined as n-type impurity region (c). (FIG. 6D)

Note that although boron is already doped into n-type impurity regions (c) 527 to 530 at a concentration of $1\times10^{15}$ to $1\times10^{18}$ atoms/$cm^3$ in the channel doping process, because phosphorus is doped at a concentration of 5 to 10 times that of boron contained in the p-type impurity region (b), the effect of boron may be neglected.

Strictly speaking however, while concentration of phosphorus in portions of n-type impurity region (b) 515 to 517 that overlapped with gate wirings remains at $2\times10^{16}$ to $5\times10^{19}$ atoms/$cm^3$, portions that do not overlap with gate wirings are further added with phosphorus of $1\times10^{16}$ to $5\times10^{18}$ atoms/$cm^3$, and contain phosphorus at a slightly higher concentration.

Next, the gate insulating film 518 is etched in a self-aligned manner with gate electrodes 521 to 524b as masks. Dry etching is used for the etching process and $CHF_3$ gas may be used as an etchant. Note that the etchant need not be limited to this material. Thus, gate insulating films 531 to 534a and 534b under the gate wirings are formed. (FIG. 6E)

By exposing the active layers in this manner, acceleration voltage in the doping process of impurity elements next performed can be kept low. Accordingly throughput is increased since the necessary dose amount is small. Needless to say, the impurity regions may also be formed by through doping without etching the gate insulating film.

Resist masks 535a to 535d are next formed to cover the gate wirings, and impurity regions 536 to 544 containing phosphorus at a high concentration were formed by adding n-type impurity element (phosphorus in embodiment 1). Again ion doping (ion implantation is also acceptable) was conducted by utilizing phosphine ($PH_3$) and the phosphorus concentration in these regions is set at $1\times10^{20}$ to $1\times10^{21}$ atoms/$cm^3$ (specifically $2\times10^{20}$ to $5\times10^{21}$ atoms/$cm^3$). (FIG. 6F)

Note that in this Specification an impurity region containing n-type impurity element in the above stated concentration range is defined as n-type impurity region (a). Further, although phosphorus and boron, added in the preceding processes, are already contained in the impurity regions 536 to 544, influence of phosphorus or boron added in the preceding processes need not be considered since phosphorus is later added at a sufficiently high concentration. Therefore, it is acceptable to refer the impurity regions 536 to 544 to as n-type impurity region (a) in this Specification.

Resist masks 535a to 535d are then removed, and new resist mask 545 is formed. Then, p-type impurity element (boron in the present embodiment) is doped, and impurity regions 546 and 547 that include boron at a high concentration are formed. Here, boron is doped at a concentration of $3\times10^{20}$ to $3\times10^{21}$ atoms/$cm^3$ (typically $5\times10^{20}$ to $1\times10^{21}$ atoms/$cm^3$) by ion doping using diborane ($B_2H_6$) (needless to say, ion implantation is also acceptable). In the present specification, an impurity region that includes p-type impurity region in the above stated concentration range is defined as p-type impurity region (a). (FIG. 7A)

Phosphorus is already doped in a portion of impurity regions 546 and 547 (n-type impurity regions (a) 536 and 537 stated above) at a concentration of $1\times10^{20}$ to $1\times10^{21}$ atoms/cm$^3$. However boron is doped at a concentration higher by at least 3 times here. Therefore, already formed n-type impurity regions are totally inverted to p-type, and function as p-type impurity regions. Accordingly, it is acceptable to define impurity regions 546 and 547 as p-type impurity regions (a).

After removing resist mask 545, a first interlayer insulating film 548 is formed. As a first interlayer insulating film 548, an insulating film comprising silicon, concretely a silicon nitride film, a silicon oxide film, a silicon oxynitride film or a laminate film combining these may be formed. The film thickness may be 50 to 400 nm (preferably 100 to 200 nm).

In the present embodiment a 200 nm thick silicon oxynitride film (note that nitrogen concentration is 25 to 50 atomic %) is adopted, that is formed by plasma CVD from raw material gases of SiH$_4$, N$_2$O and NH$_3$. This first interlayer insulating film 548 has an effect of preventing increase of resistivity due to oxidation of gate wiring 521 to 524a and 524b in the next performed heat treatment process (activation process).

A heat treatment process is performed next in order to activate the impurity elements of n-type or p-type conductivity and which have been doped at their respective concentrations. Furnace annealing, laser annealing or rapid thermal annealing (RTA) can be performed for this process. The activation process is performed by furnace annealing in embodiment 1. Heat treatment is performed in a nitrogen atmosphere at between 300 and 650° C., preferably from 400 to 550° C., here at 550° C. for 4 hours here. (FIG. 7B)

At this time, the catalytic element (nickel in embodiment 1) used in crystallization of an amorphous silicon film in embodiment 1 moved in the direction of the arrows and is captured in a region containing phosphorus at a high concentration (gettering) formed in the process of FIG. 6F. This is a phenomenon originated from gettering effect of a metal element by phosphorus. As a result, the concentration of the catalytic element contained in later formed channel forming regions 549 to 553 is reduced below $1\times10^{17}$ atoms/cm$^3$. Note however because concentrations below $1\times10^{37}$ atoms/cm$^3$ is the detection limit of SIMS for nickel, it is impossible to measure with the present technology.

Conversely, the catalytic element precipitated at a high concentration in the regions which functioned as gettering sights of the catalytic element (regions where impurity regions 536 to 544 were formed in the process of FIG. 6F), and it existed in these regions at a concentration exceeding $5\times10^{18}$ atoms/cm$^3$ (typically $1\times10^{19}$ to $5\times10^{20}$ atoms/cm$^3$). However since it is acceptable if the regions that became the gettering sights function as a source region or a drain region, it is presumed that the existence of nickel do not cause any problem.

Further, a hydrogenation process is performed on the active layers by performing heat treatment in an atmosphere containing 3 to 100% hydrogen at 300 to 450° C. for 1 to 12 hours. This is a process to terminate dangling bonds in the semiconductor layers by thermally activated hydrogen. Plasma hydrogenation (using hydrogen activated by plasma) may be performed as another hydrogenation means.

The second interlayer insulating film 554 is formed into 500 nm to 1.5 mm thickness over the first interlayer insulating film 548 after the activation process. In embodiment 1 a silicon oxide film having 800 nm thickness is formed by plasma CVD as the second interlayer insulating film 554.

Thus an interlayer insulating film of 1 mm thickness is formed from a laminate of the first interlayer insulating film (silicon oxynitride film) 548 and the second interlayer insulating film (silicon oxide film) 554.

Note that, it is possible to use organic resin insulating films such as polyimide, acrylic, polyamide, polyimide amide, BCB (benzocyclobutene) for the second interlayer insulating film 554.

Contact holes are then formed in order to reach the source regions or the drain regions of the respective TFTs, and source wirings 555 to 558, and drain wirings 559 to 562 are formed. Note that, although not shown in the figures, the drain wirings 559 and 560 are formed from the same wiring in order to form a CMOS circuit. Note that, in embodiment 1 the electrodes are made with a three-layer structure laminate film of a 100 nm Ti film, a 300 nm aluminum film containing Ti, and a 150 nm Ti film formed successively by sputtering.

A silicon nitride film, a silicon oxide film, or a silicon oxynitride film is formed to a thickness of between 50 and 500 nm (typically 200 to 300 nm) next as a passivation film 563. (FIG. 7C)

It is effective to perform a plasma treatment using a gas that contains hydrogen such as H$_2$ and NH$_3$ preceding formation of the film and to perform heat treatment after the to film formation. The preceding process provides excited hydrogen into the first and second interlayer insulating films. By performing a heat treatment to this state, the active layers are effectively hydrogenated because hydrogen added into the first and second interlayer insulating films is diffused in the layer underneath, as well as improving the film quality of passivation film 563.

Further, after forming the passivation film 563, an additional hydrogenation process may be performed. For example, it is good to perform heat treatment for 1 to 12 hours at between 300 and 450° C. in an atmosphere including from 3 to 100% hydrogen. Or, a similar result can be obtained by using plasma hydrogenation.

Note that openings may be formed here in the passivation film 563 at positions where contact holes will be formed later in order to connect the pixel electrode and the drain wirings.

A third interlayer insulating film 564 (in the present specification it is occasionally referred to as planarization film) comprising a resin material (it may also be referred to as organic material) (hereinafter referred to as resin insulating film) is formed with an approximately 1 to 3 μm (typically 1.5 to 2 μm), as shown in FIG. 7D.

Polyimide, acrylic, polyamide, polyimide amide, BCB (benzocyclobutane), or Cyclotene, can be used as the resin material. The following points can be given as the benefits of using a resin insulating film: superior levelness; and low dielectric constant. Note that in addition to the above, other organic resin insulating films, organic SiO compounds, etc. can be used. It is possible to use an insulating film comprising inorganic material if the superior in flatness.

Note that though an acrylic film which polymerizes by heat after application to the substrate is used here, one that polymerizes by light radiation may also be used. Needless to say, a photo sensitive material of positive type or negative type is also acceptable.

Further, it is possible to provide a resin film colored by pigment etc. as a part of layer of the third interlayer insulating film 564 and use is as the color filter.

A shielding film 565 is formed next on the third interlayer insulating film (planarization film) 564 comprising resin material in the pixel section. A term "shielding film" is used through the specification to a conductive film which has a characteristic of shielding light or electromagnetic wave.

The shielding film 565 is formed from a metallic film comprising an element selected from among aluminum (Al), titanium (Ti), and tantalum (Ta) or a metal film with one of these as its principal constituent (in the present embodiment an element is regarded as the principal constituent when it is contained at over 50 weight %) to a thickness between 100 and 300 nm. In the present Embodiment an aluminum film containing titanium at 1 wt % is formed into 125 nm thick. Note that in some cases this shielding film is referred to as "first conductive film" in the present specification.

Note that a silicon oxide film is formed to a thickness of 5 to 50 nm (typically 20 to 30 nm) prior to forming the shielding film 565. The shielding film 565 is then formed thereon and a silicon oxide film denoted as 566 is formed by performing etching treatment onto the above stated insulating film as the shielding film 565 as a mask.

Though the silicon oxide film 566 is disposed to increase adhesiveness of the third interlayer insulating film 564 and the shielding film 565, it is preferable to remove it from the region where the shielding film does not exist, because it will be a hindrance in forming a contact hole in the third interlayer insulating film. Note that the adhesiveness to the shielding film formed on this film can be increased by surface refinement also by performing plasma processing using $CF_4$ gas on the surface of the third interlayer insulating film 564.

Further, it is possible to form other connecting wirings, not only the shielding film, by using the aluminum film containing titanium. For example, a connecting wiring for connecting between circuits can be formed inside the driver circuit. However, in this case, before depositing the material that forms the shielding film or the connecting wiring, it is necessary to form contact holes, in advance, in the third interlayer insulating film.

Next, an oxide with a thickness from 20 to 0.100 nm (preferably between 30 and 50 nm) is formed on the surface of the shielding film 565 by publicly known anodic oxidation or plasma oxidation (Anodic oxidation in the present embodiment). An aluminum oxide film (alumina film) is formed here as the anodic oxide 567 because a film with aluminum as its principal constituent is used as the shielding film 565 and anodic oxidation is performed in embodiment 1. This anodic oxide 567 will be a dielectric for the storage capacitor of the present embodiment.

Further, the structure used here has the insulator being formed by anodic oxidation only on the surface of the shielding film, but other insulator may also be formed by a gas phase method, such as plasma CVD, thermal CVD, or sputtering. In that case also, it is preferable to make the film thickness from 20 to 100 nm (more preferably between 30 and 50 nm).

Contact holes are formed next in the third interlayer insulating film 564 and in the passivation film 563 in order to reach the drain wiring 562, and the pixel electrode 569 is formed. Note that pixel electrodes 570 and 571 are each separate pixel electrodes for adjoining pixels in this embodiment. A transparent conductive film may be used for the pixel electrodes 569 to 571, in concrete, indium tin oxide (ITO) film with a thickness of 110 nm is formed here by sputtering. Note that there are cases in which the pixel electrode is referred to as the "second conductive film" in the present specification.

Note that a metallic film may be used as the material for the pixel electrode in case of forming a reflection type liquid crystal display device.

Further, a storage capacitor 572 is formed at this point where the pixel electrode 569 and the shielding film 565 overlap through the anodic oxide film 567. Note that though only the storage capacitor 572 is numbered, all regions where the shielding film and the pixel electrode overlaps functions as a storage capacitor.

Because an alumina film which has a high dielectric constant of 7 to 9 is used as the dielectric of the storage capacitor, reduction of the area for forming a required capacitance is available. Further, by using the shielding film which is formed over that pixel TFT as an electrode of the storage capacitor, the aperture ratio of the image display section of an active matrix liquid crystal display device can be increased.

In this case it is preferable to set the shielding film 565 at floating state (electrically isolated state) or a constant electric potential, more preferably at a common electric potential (median electric potential of image signals sent as data).

Through the foregoing steps, an active matrix substrate (first substrate) on which the pixel TFT and the pixel electrode were formed, was formed.

Next, steps of forming an active matrix type liquid crystal display device from the active matrix substrate (first substrate) will be described. First, an alignment film 573 was formed on the first substrate on which the pixel TFT and the pixel electrode were formed. A transparent conductive film 575 and an alignment film 576 were formed on an opposite substrate (second substrate) 574. A color filter or a shielding film may be formed on the second substrate as needed. In this embodiment, a polyimide film is used as the alignment film. After the alignment film 573 was applied by a roll coater, it was heated at 200° C. for 90 minutes. Incidentally, it is preferable that the first substrate is washed before the alignment film 573 is formed. Thereafter, the surface of the alignment film was rubbed with a roller on which a cloth was fixed, and a rubbing orientation processing was performed so that liquid crystal molecules were oriented with a constant pretilt angle (6° to 10°, preferably 7° to 8°).

Next, photosensitive acryl resin (NN700: made by JSR), as a spacer material layer, was spin coated on the alignment film 573 at 900 rpm so that its thickness was made 4.7 μm. Thereafter, heating at 80° C. for 3 minutes was carried out by using a hot plate. The thickness of the photosensitive acryl resin film after heating was made 4.0 μm.

After a pattern (size: 6 μm square) of a columnar spacer was exposed to the thus formed spacer material layer through a mask for exposure, development was made. The development conditions were made such that CD-700 (TMAH 0.14%) was used as a developing solution, solution temperature was made 18±1° C., and a development time was made 60 seconds. Next, heating at 180° C. for 1 minute was carried out using a clean oven.

In this way, a columnar spacer 568 was formed on the first substrate (FIG. 8A). Since the formation position of the columnar spacer 568 can be freely designed, an image display region can be effectively used. Incidentally, the pretilt angle was changed to 4° to 5° through the developing solution.

Figure 12:
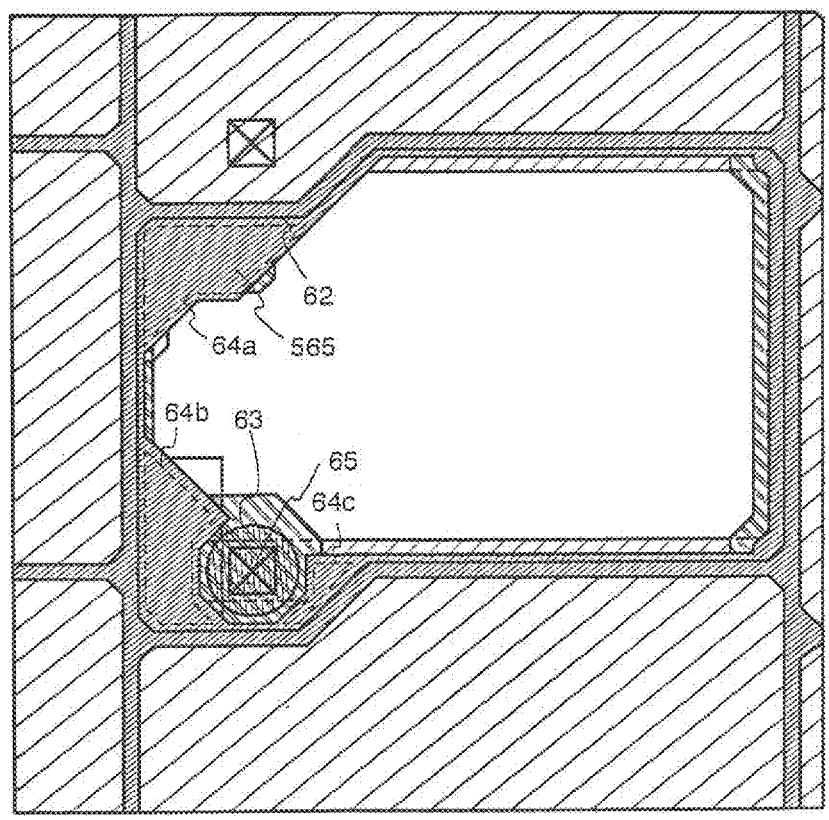
FIG. 12 is a top view showing a pixel structure.

FIG. 12 is a view showing a pixel structure of this embodiment seen from the above. As shown in FIG. 12, in this embodiment, a columnar spacer 63 is provided over a contact portion 65 where a pixel TFT is electrically connected to a pixel electrode 62. Besides, in FIG. 12, reference numeral 565 designates a shielding film, and the pixel electrode 62 is provided thereon through a not-shown oxide 567. At this time, storage capacitances 64a to 64c are formed of the shielding film 565, the oxide 567, and the pixel electrode 62. By adopting the structure of this embodiment, it becomes possible to fill a stepped portion (corresponding to the film thickness of the interlayer insulating film 564) formed at the contact portion, and defective orientation in liquid crystal molecules due to the stepped portion can be prevented.

Figure 2B:
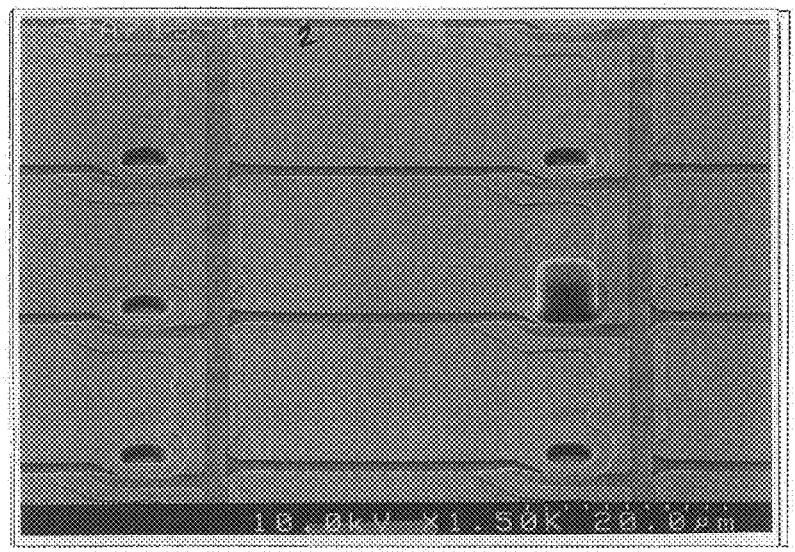
Figure 2C:
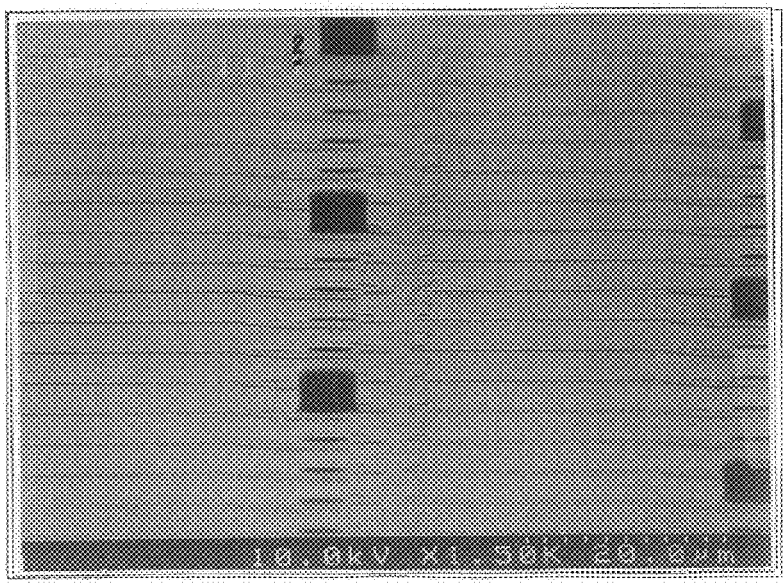
Figure 17A:
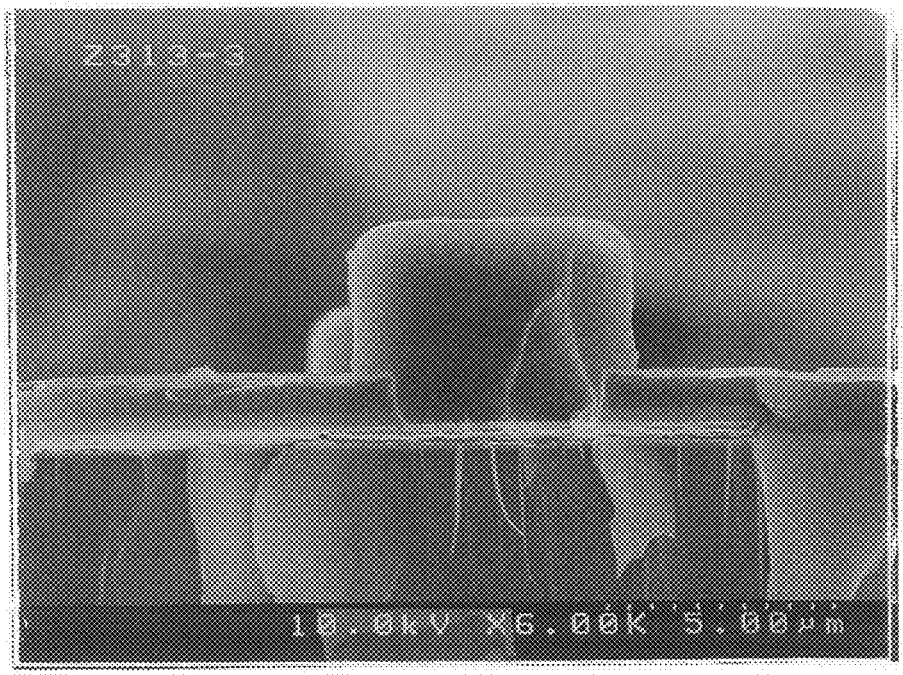
FIGS. 17A and 17B are SEM observation photographs of columnar spacers of the present invention.

Like this, in this embodiment, there is shown an example in which the columnar spacer is formed over the contact portion of the TFT and the pixel electrode. However, as long as the columnar spacer 568 is formed at a region which is not used as an image display region, such as a region on a shielding film or a source wiring, the position is not particularly limited. In this embodiment, the columnar spacers were regularly disposed at the pixel portion at a rate of about 100 spacers per 1 mm$^2$. FIG. 17A is a view of an SEM observation photograph of a section of the columnar spacer of this embodiment. FIG. 1A is a view of an SEM observation photograph showing its outer appearance, FIG. 2A is a schematic view showing its arrangement, and FIGS. 2B and 2C are SEM observation photographs corresponding to FIG. 1A and having different magnifications.

The shape of this columnar spacer was such that there was little taper portion, the top portion had a flat surface, the height H was 4 μm, the width L1 was 6 μm, and the radius of curvature was 1 μm or less. The angle α between the tangent plane at the center of a side of the columnar spacer and the substrate surface was 85° to 95°, and it was almost vertical. By making such a shape, light leakage can be decreased.

Then the active matrix substrate on which the pixel portion and the driver circuit are formed is bonded to the opposite substrate by a well-known cell assembling step through a sealing material 579. In this embodiment, the substrate interval was kept constant by using the sealing material containing a filler 580. Besides, in this embodiment, since the columnar spacer 568 made of a resin material with excellent elasticity is used, pressure applied at the bonding step can be absorbed (relieved). Besides, in the spacer of this embodiment, since a contact area to an element is larger than that of a bead-like spacer, there does not occur such a case where an excessive pressure is applied to a specific portion.

Thereafter, a liquid crystal 578 is injected between both the substrates, and they are completely sealed by a sealant (not shown). A well-known liquid crystal material may be used for the liquid crystal. In this way, the active matrix type liquid crystal display device shown in FIG. 5B is completed.

Incidentally, in FIG. 8B, a p-channel TFT 701 and n-channel TFTs 702 and 703 are formed in the driver circuit, and a pixel TFT 704 made of an n-channel TFT is formed in the pixel portion.

Incidentally, the sequence of the steps of this embodiment may be suitably changed. Even if any sequence is adopted, if the structure of a finally formed TFT is a structure as shown in FIG. 5B, the basic function of the active matrix substrate is not changed, and the effect of the present invention is not spoiled.

A channel forming region 601, a source region 602 and a drain region 603 are each formed by a p-type impurity region (a) in the p-channel TFT 701 of the driver circuit. Note that a region that contains phosphorus at a concentration of $1 \times 10^{20}$ to $1 \times 10^{21}$ atoms/cm$^3$ exists in a portion of a source region or a drain region in effect. Further in that region the catalytic element gettered in the process of FIG. 7B exists at a concentration exceeding $5 \times 10^{18}$ atoms/cm$^3$ (typically $1 \times 10^{19}$ to $5 \times 10^{20}$ atoms/cm$^3$).

Further, a channel forming region 604, a source region 605, and a drain region 606 are formed in the n-channel TFT 702, and a LDD region overlapping with the gate wiring by interposing a gate insulating film (such region is referred to as Lov region. 'ov' means overlap) 607 is formed in one side of the channel forming region (drain region side). Here, Lov region 607 contains phosphorus at a concentration of $2 \times 10^6$ to $5 \times 10^{19}$ atoms/cm$^3$, and is formed to completely overlap with the gate wiring.

A channel forming region 608, a source region 609, and a drain region 610 are formed in the n-channel TFT 703. LDD regions 611 and 612 are formed in both sides of the channel forming region. Note that the LDD regions overlapping with the gate wiring by interposing an insulating film (Lov regions) and the LDD regions that are not overlapped with the gate wiring (such region is referred to as Loff regions. 'off' means offset) are realized because a portion of the LDD regions 611 and 612 are placed so as to overlap with the gate wiring in this structure.

Figure 9:
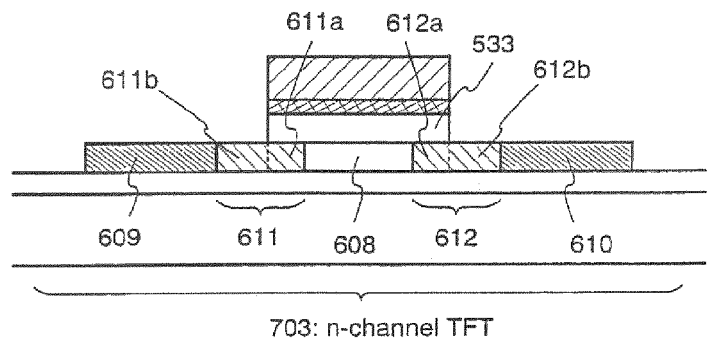
FIG. 9 is a sectional structural view of a TFT.

A cross sectional view shown in FIG. 9 is an enlarged diagram showing n-channel TFT 703 shown in FIG. 8B in the state of being manufactured to the process of FIG. 7B. As shown here, LDD region 611 is further classified into Lov region 611a and Loff region 611b, and LDD region 612 is further classified into Lov region 612a and Loff region 612b. Phosphorus is contained in the Lov regions 611a and 612a at a concentration of $2 \times 10^{16}$ to $5 \times 10^{19}$ atoms/cm$^3$, whereas it is contained at a concentration 1 to 2 times as much (typically 1.2 to 1.5 times) in the Loff regions 611b and 612b.

Further, channel forming regions 613 and 614, a source region 615, a drain region 616, Loff regions 617 to 620, and an n-type impurity region (a) 621 contacting the Loff regions 618 and 619 are formed in the pixel TFT 704. The source region 615, and the drain region 616 are each formed from n-type impurity region (a) here, and the Loff regions 617 to 620 are formed by n-type impurity region (c).

The structure of the TFTs forming each of the circuits or elements of the pixel section and the driver circuits can be optimized to correspond to the required circuit specifications, and the operation performance of the semiconductor device and its reliability can be increased in the present embodiment. Specifically, the LDD region placement in an n-channel TFT is made to differ depending upon the circuit specifications, and by using an Lov region or an Loff region properly, TFT structures with fast operating speeds and which place great importance on measures to counter hot carriers, and TFT structures that place great importance on low off current operation, can be realized over the same substrate.

For the case of an active matrix liquid crystal display device, for example, the n-channel TFT 702 is suitable for driver circuits that place great importance on high operating speed, such as a shift register circuit, a signal divider circuit, a level shifter circuit, and a buffer circuit. In other words, by placing the Lov region in only one side (the drain region side) of the channel forming region, this becomes a structure that reduces the resistive constituents as much while placing great importance on hot carrier countermeasures. This is because, for the case of the above circuit group, the source region and the drain region functions do not change, and the carrier (electron) movement direction is constant. However, if necessary, Lov regions can be placed in both sides of the channel forming region.

Further, the n-channel TFT 703 is suitable for a sampling circuit (sample and hold circuit) which places emphasis on both hot carrier countermeasures and low off current operation. In other words, hot carrier countermeasures can be realized by placement of the Lov region, and in addition, low off current operation is realized by placement of the Loff region. Furthermore, the functions of the source region and the drain region of a sampling circuit reverse, and the carrier movement direction changes by 180°; therefore a structure that has linear symmetry with the center of the gate wiring must be used. Note that it is possible to only form the Lov region, depending upon the circumstances.

Further, the n-channel TFT 704 is suitable for a pixel section or a sampling circuit (sample and hold circuit) which place great importance on low off current operation. Namely, the Lov region, which is a cause of an increase in the off current value, is not employed, only the Loff region is used, allowing low off current operation to be realized. Furthermore, by utilizing a LDD region with a concentration lower than that of the driver circuit LDD region as the Loff region, although the on current value will fall a little, it is a thorough measure for lowering the off current value. Additionally, it has been confirmed that an n-type impurity legion (a) 621 is extremely effective in lowering the off current value.

Further, the length (width) of the Lov region 607 of the n-channel TFT 702 may be between 0.1 and 3.0 μm, typically from 0.2 to 1.5 μm. Further, the length (width) of the Lov regions 611a and 612a of the n-channel TFT 703 may be from 0.1 to 3.0 μm, typically between 0.2 and 1.5 μm, and the length (width) of the Loff regions 611b and 612b may be from 1.0 to 3.5 μm, typically between 1.5 and 2.0 μm. Moreover, the length (width) of the Loff regions 617 to 620 formed in the pixel TFT 704 may be from 0.5 to 3.5 μm, typically between 2.0 and 2.5 μm.

The structure of the above stated active matrix liquid crystal display device is described with reference to the perspective view of FIG. 10. An active matrix substrate (the first substrate) comprises a pixel portion 802, a driver circuit 803 on the gate side, and a driver circuit 804 on the source side formed over a glass substrate 801. A pixel TFT 805 in the pixel portion (which corresponds to the pixel TFT 704 shown in FIG. 5B) is an n-channel TFT, and is connected with a pixel electrode 806 and a storage capacitor 807 (which corresponds to the storage capacitor 572 shown in FIG. 8A).

The driver circuits provided on the periphery are formed based on a CMOS circuit. The driver circuit 803 on the gate side and the driver circuit 804 on the source side are connected to the pixel portion 802 through a gate wiring 808 and a source wiring 809, respectively. An external input/output terminal 811 connected with an FPC 810 is provided with input/output wirings (connecting wirings) 812 and 813 for transmitting signals to the driver-circuits. Reference numeral 814 denotes an opposing substrate (the second substrate).

Figure 10:
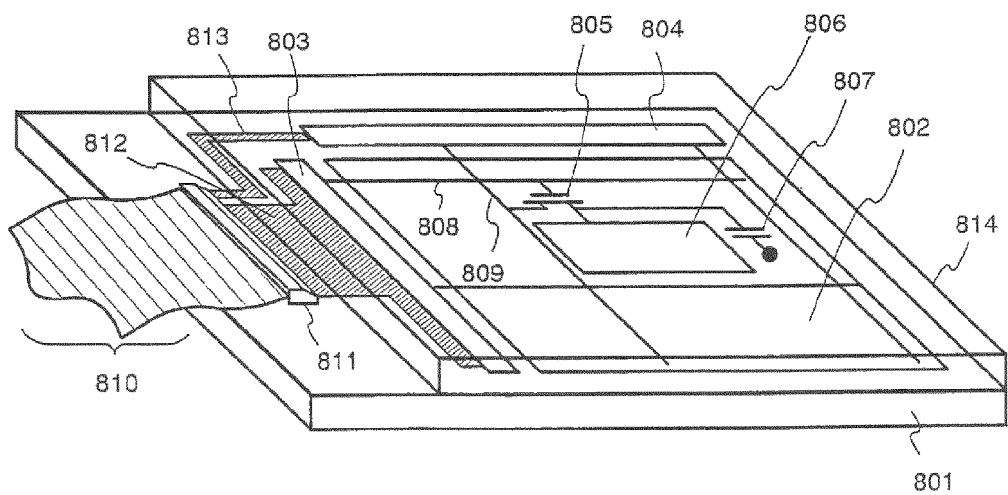
FIG. 10 is a view showing an outer appearance of an AM-LCD.

It is to be noted that, though the semiconductor device illustrated in FIG. 10 is herein referred to as an active matrix liquid crystal display device, a liquid crystal panel having an FPC attached thereto such as the one illustrated in FIG. 10 is generally referred to as a liquid crystal module. Accordingly, the active matrix liquid crystal display device in the present embodiment may also be referred to as a liquid crystal module.

Figure 11:
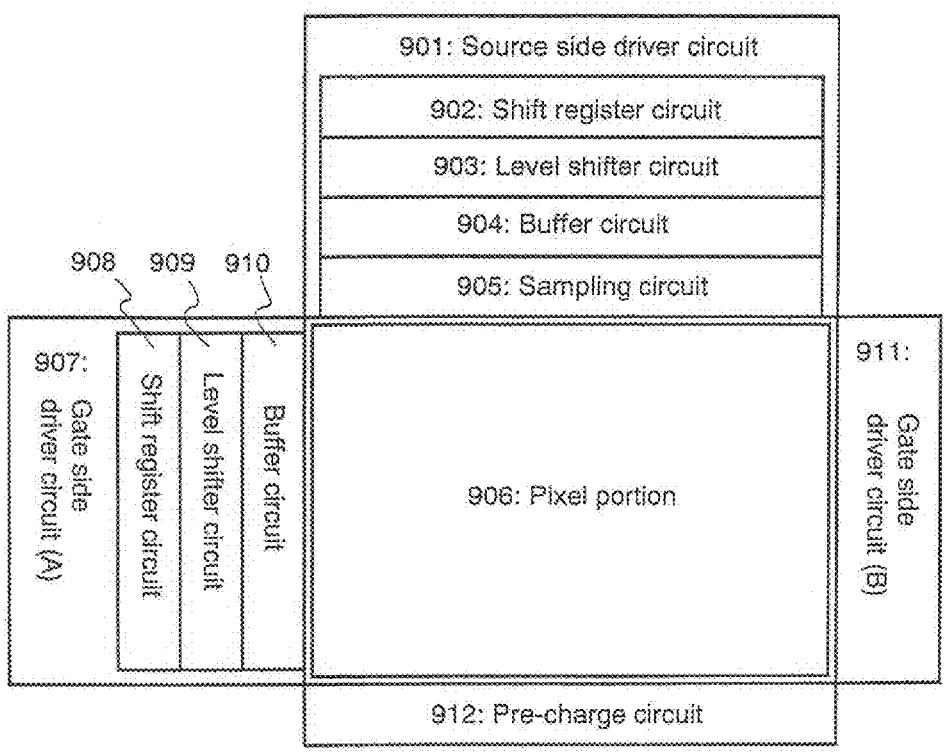
FIG. 11 is a view showing a structure of a pixel portion and a driver circuit.

FIG. 11 shows an example of circuit structure of the above stated liquid crystal display device. The liquid crystal display device of the present embodiment comprises a source side driver circuit 901, a gate side driver circuit (A) 907, a gate side driver circuit (B) 911, a pre-charge circuit 912 and a pixel section 906. Through the Specification, driver circuit is a generic name including a source side driver circuit and a gate side driver circuit.

The source side driver circuit 901 is provided with a shift register circuit 902, a level shifter circuit 903, a buffer circuit 904, and a sampling circuit 905. Further, the gate side driver circuit (A) 907 is provided with a shift register circuit 908, a level shifter circuit 909, and a buffer circuit 910. The gate side driver circuit (B) 911 has a similar structure.

The driver voltages for the shift register 902 and 908 is between 5 and 16 V here (typically 10 V), and the structure shown by reference numeral 702 in FIG. 8B is suitable for n-channel TFTs used in the CMOS circuits forming the circuits.

Furthermore, the driver voltage becomes high at between 14 and 16 V for the level shifter circuit 903 and 909, and the buffer circuit 904 and 910, but similar to the shift register circuits, CMOS circuits comprising the n-channel TFT 702 shown in FIG. 8B are suitable. Note that using a multi-gate structure, such as a double gate structure and a triple gate structure for the gate wiring is effective in increasing reliability in each circuit.

Further, the sampling circuit 905 has a driver voltage of between 14 and 16 V, but the source region and the drain region are inverted and it is necessary to reduce the off current value, so CMOS circuits comprising the n-channel TFT 703 of FIG. 8B are suitable. Note that only the n-channel TFT is shown in FIG. 5B, but in practice the n-channel TFT and a p-channel TFT are combined when forming the sampling circuit.

Further, the pixel section 906 has a driver voltage of between 14 and 16 V, but it is necessary to reduce the off current value even lower than that of the sampling circuit 905. Therefore it is preferable to use a structure in which Lov region that causes increase in off current is not disposed, and it is preferable to use n-channel TFT 704 of FIG. 5B for the pixel TFT.

[Embodiment 2]

In this embodiment, an example in which a columnar spacer is provided at a place other than a sealing region and mechanical strength is reinforced, will be described with reference to FIGS. 13A and 13B. This embodiment shows a region (external terminal connection portion) which is not shown in FIG. 5B of the embodiment 1. Thus, the drawing corresponds to FIG. 8B of the embodiment 1 and the same reference symbols are partially used. Incidentally, the only point different from the embodiment 1 is that a filler is not shown in a sealing material 1000.

Figure 13A:
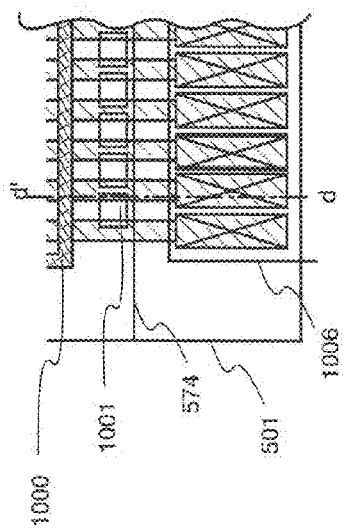
FIGS. 13A and 13B are views showing examples of a connection portion to an external terminal.
Figure 13B:
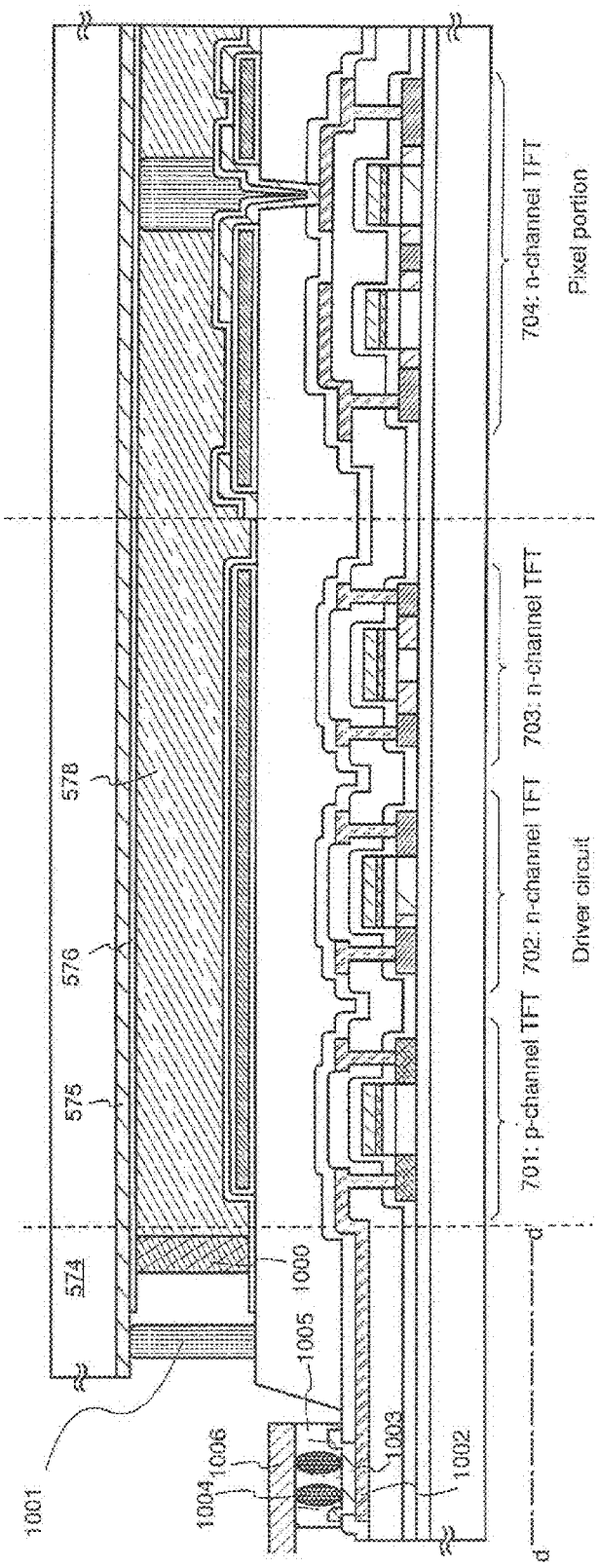

FIG. 13A is a top view of the external terminal connection portion, and FIG. 13B is a sectional structural view of the external terminal connection portion. Besides, a sectional structure taken along d-d' of the top view is also shown.

In FIGS. 13A and 13B, reference numeral 1001 designates a columnar spacer; 1002, an external terminal connection portion; 1003, an ITO film; 1004, a conductive spacer; 1005, an adhesive; and 1006, an FPC.

The external terminal connection portion 1002 connected to the FPC 1006 extends from a source electrode (wiring) of a p-channel TFT 701.

In this embodiment, the columnar spacer 1001 is formed between a sealing region where the sealing material 1000 exists and an end portion of an opposite substrate 574. This columnar spacer 1001 is provided between extraction wirings, and reinforces the mechanical strength. Besides, this columnar spacer 1001 has an effect to prevent cutting defects also in a cutting step of the opposite substrate. Incidentally, here, the wiring between the source electrode of the p-channel TFT 701 and the external terminal connection portion is called the extraction wiring.

This columnar spacer can be formed in the same step as that formed at the contact portion in the embodiment 1.

The ITO film 1003 is formed on the external terminal connection portion 1002 in the same step as the pixel electrode, and excellent contact with the FPC is formed. Incidentally, a conductive spacer such as a gold paste is mixed in the adhesive 1005, and the FPC 1006 is connected to the ITO film 1003 by clamping.

[Embodiment 3]

Figure 14A:
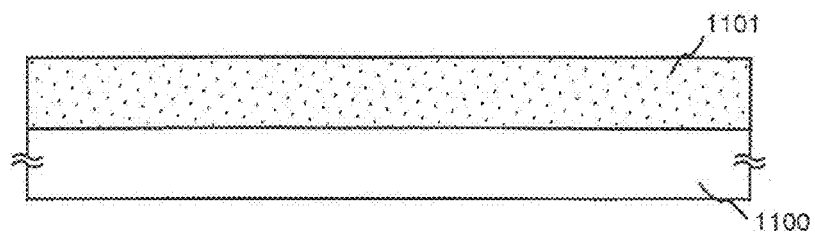
FIGS. 14A to 14E are views showing fabricating steps of the present invention.
Figure 14B:
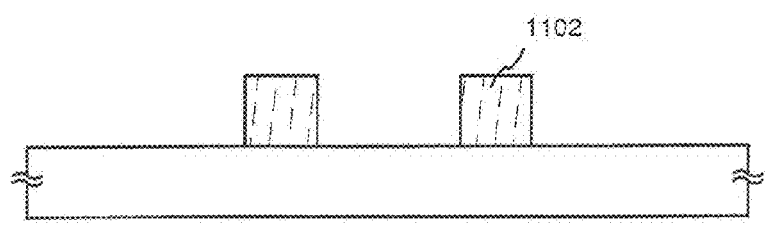
Figure 14C:
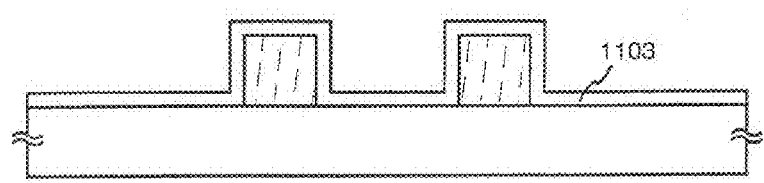
Figure 14D:
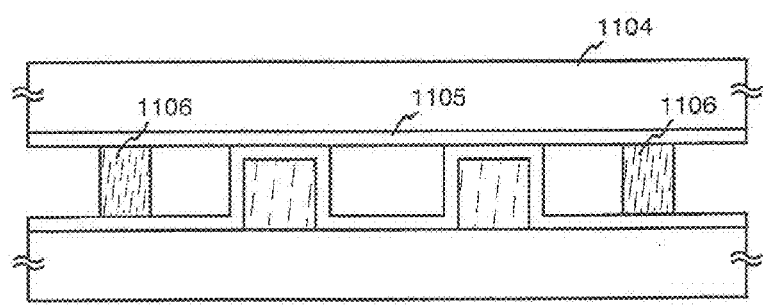
Figure 14E:
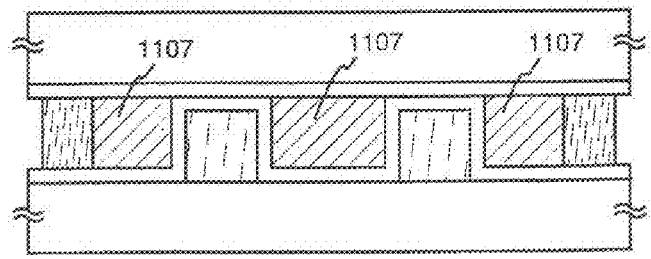
Figure 15:
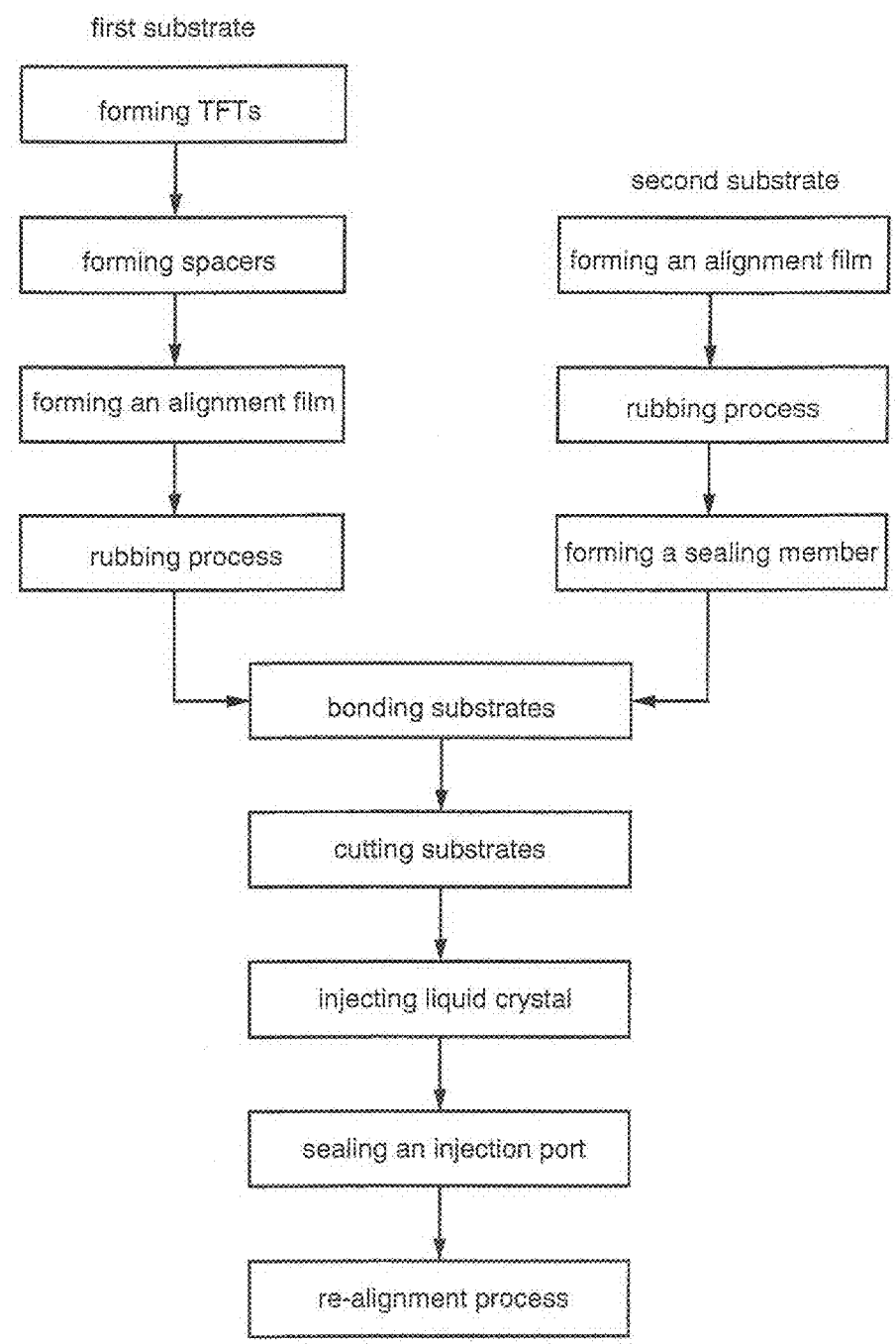
FIG. 15 is a view showing a flowchart of fabricating steps of the present invention.

In this embodiment, a description will be made on an example in which a columnar spacer is formed by a following method (FIGS. 14A to 14E are simplified step views, and FIG. 15 is a flowchart) different from the embodiment 1. In this embodiment, step sequence is different from the embodiment 1, and a columnar spacer is formed before formation of an alignment film.

A procedure will be described in brief with reference to FIGS. 14A to 14E. First, a spacer material layer 1101 is formed on a first substrate 1100 (FIG. 14A). Next, similarly to the embodiment 1, exposure and development are performed, so that columnar spacers 1102 are formed (FIG. 14B). Next, an alignment film 1103 covering the columnar spacer 1102 is formed, and a rubbing processing is performed (FIG. 14C). Next, a second substrate 1104 on which an alignment film 1105 and a seal 1106 are formed is bonded to the first substrate 1100 (FIG. 14D). Next, the first substrate and the second substrate are cut into a suitable shape, a liquid crystal material 1107 is injected, and sealing is made, so that a liquid crystal panel is completed (FIG. 14E).

The details will be described below.

First, similarly to the embodiment 1, an active matrix substrate (first substrate) is formed. The exact same steps were used until a step of forming pixel electrodes 569 and 570. Next, a columnar spacer 1201 was formed on the first substrate by using the same spacer material as the embodiment 1 and under the same conditions (film formation condition, exposure condition, development condition, baking condition, etc.).

Next, an alignment film 1202 was formed to cover the columnar spacer (FIG. 16A). Thereafter, a rubbing processing was performed. In the following, in the same way as the embodiment 1 except for these steps, a liquid crystal display device shown in FIG. 16B was formed.

Figure 17B:
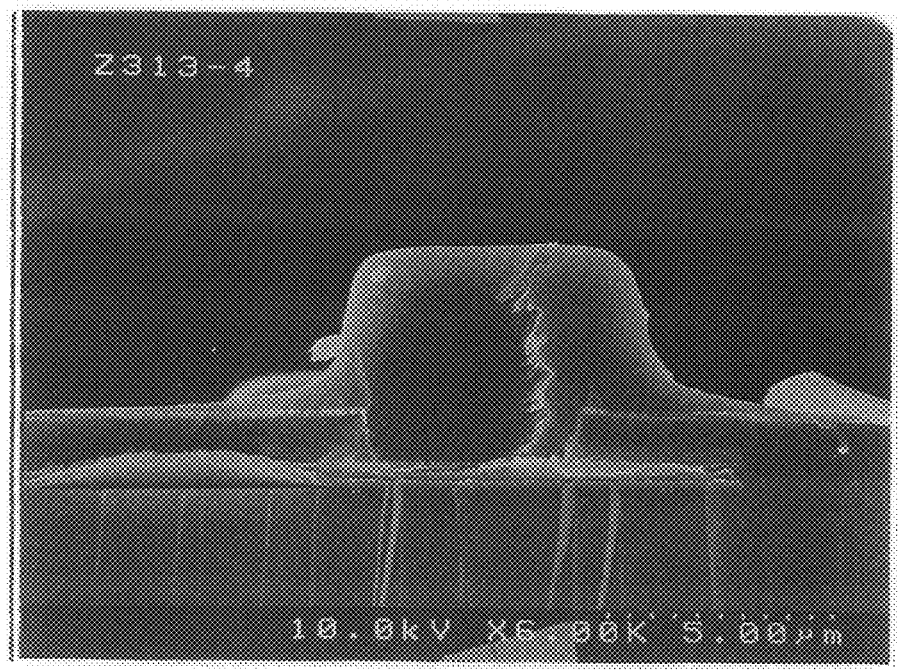

FIG. 17B is a view of an SEM observation photograph of a section of the columnar spacer of this embodiment.

The shape of this columnar spacer was such that although a taper portion existed, a top portion had a flat surface, the width L1 was 7 to 8 μm, and the radius of curvature was 2 μm. The angle α between the tangent plane at the center of a side of the columnar spacer and the substrate surface was 68°. In this embodiment, the value of the width L1 includes the thickness of the alignment film. In this embodiment, when the relation between the widths is made $1 \leq L2/L1 \leq 2.5$, light leakage at the taper portion can be decreased, so that it is desirable.

In the embodiment 1, the final pretilt angle was 4° to 5° by the influence of the developing solution. In this embodiment, since the alignment film is formed and the rubbing processing is performed after the columnar spacer is formed, the pretilt angle can be made 6° to 10°, preferably 7° to 8°, so that the orientation of liquid crystal can be made excellent.

Incidentally, this embodiment can be combined with the embodiment 2.

[Embodiment 4]

Figure 18A:
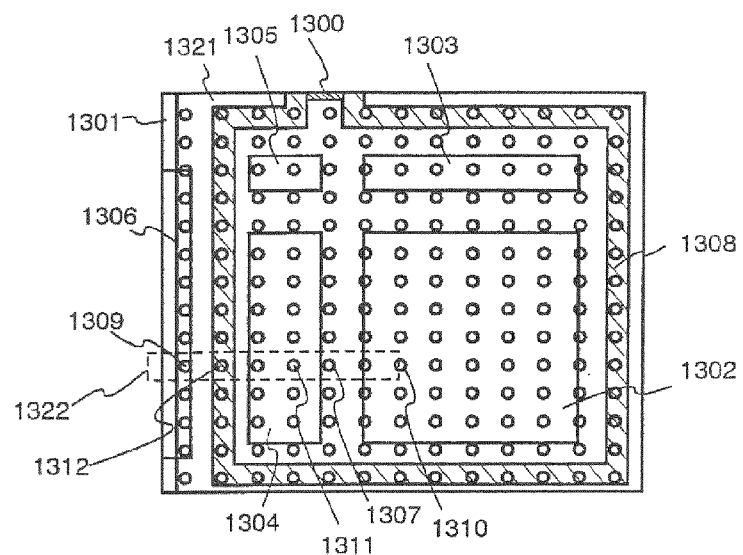
FIGS. 18A and 18B are views showing examples of arrangement of columnar spacers.

In this embodiment, a description will be made on an example in which columnar spacers are provided at a constant interval on the whole surface of a first substrate as shown in FIG. 18A.

In FIG. 18A, reference numeral 1300 designates a sealing material; 1301, a first substrate; 1302, a pixel portion; 1303, a gate side driver circuit; 1304, a source side driver circuit; 1305, a signal dividing circuit; 1306, an external connection terminal portion; 1308, In this embodiment, columnar spacers 1307 were provided between the pixel portion and the source side driver circuit, columnar spacers 1309 were provided at the external connection terminal portion, columnar spacers 1310 were provided at the pixel portion, columnar spacers 1311 were provided at the gate side driver circuit, and columnar spacers 1312 were provided at the sealing region. The columnar spacers were respectively provided at a constant interval by a photolithography method. By providing the columnar spacers at a constant interval like this, a uniform substrate interval can be maintained. Besides, by providing the columnar spacers 1312 at the sealing region, a filler may not be used. Besides, by providing the columnar spacers 1309 at the external connection terminal portion, the mechanical strength at the connection portion can be reinforced. Incidentally, the foregoing respective columnar spacers may be formed by using the fabricating method shown in the embodiment 1 or the embodiment 3.

Figure 18B:
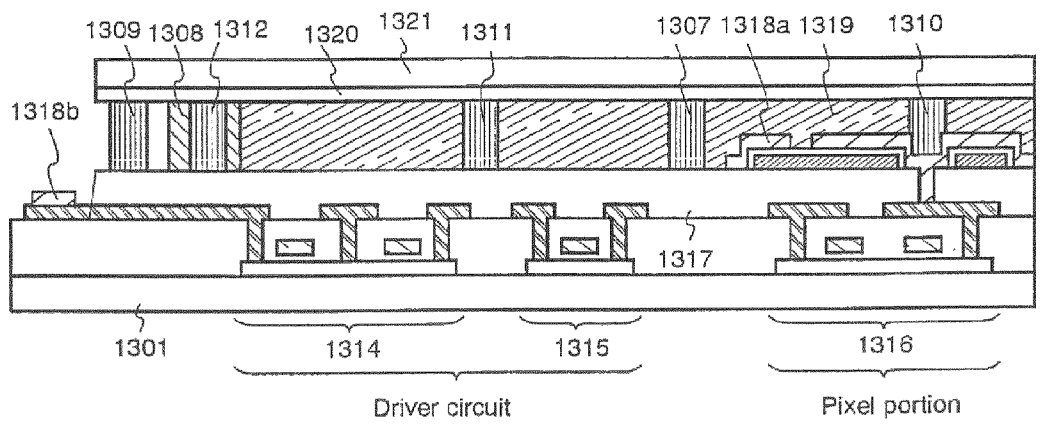

FIG. 18B schematically shows a sectional structure of a region encircled by a dotted line 1322 in FIG. 18A. The same reference symbols as those of FIG. 18A are used. In FIG. 18A, reference numeral 1314 designates a CMOS circuit; 1315, an n-channel TFT; 1316, a pixel TFT; 1317, an interlayer insulating film; 1318a, a pixel electrode; and 1318b, an ITO film. The ITO film 1318b is provided to be connected to an external terminal such as an FPC. Besides, reference numeral 1319 designates a liquid crystal material; and 1320, an opposite electrode.

Figure 19A:
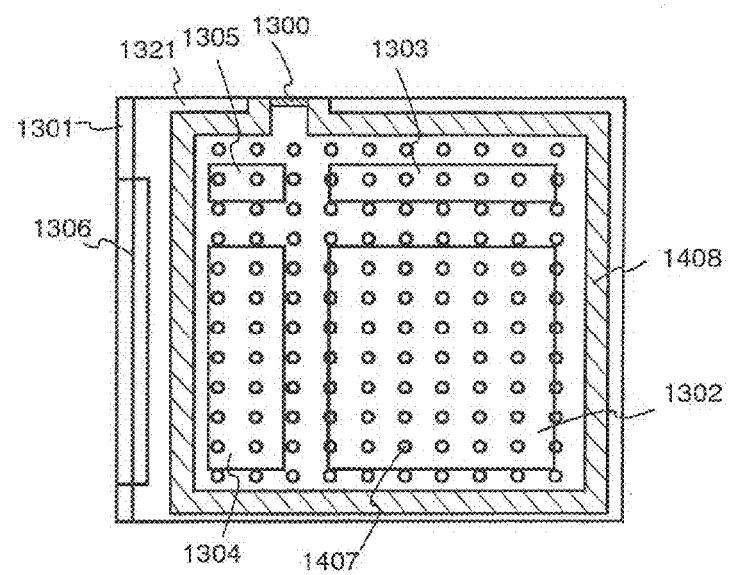
FIGS. 19A to 19C are views showing examples of arrangement of columnar spacers.
Figure 19B:
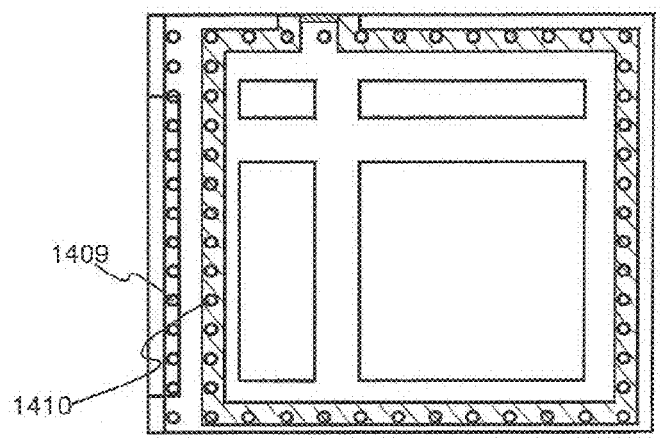
Figure 19C:
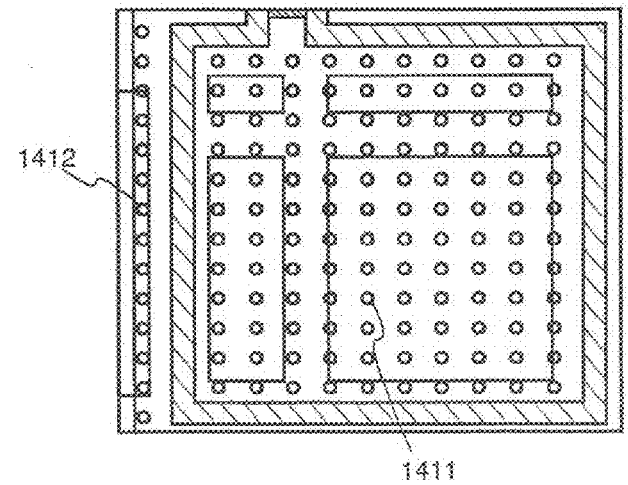

FIGS. 19A to 19C show other forms of spacer arrangement. FIG. 19A shows an example in which columnar spacers 1407 are uniformly formed inside a sealing region 1408. FIG. 19B shows an example in which a columnar spacer is not provided at a pixel portion but columnar spacers 1410 are provided at a sealing region and columnar spacers 1409 are provided at an external connection terminal portion. FIG. 19C shows an example in which columnar spacers 1411 and 1412 are formed at regions other than a sealing region. Incidentally, the foregoing respective columnar spacers may be formed by using the fabricating method shown in the embodiment 1 or the embodiment 3.

Incidentally, this embodiment can be freely combined with the embodiments 1 to 3.

[Embodiment 5]

In the present Embodiment an active matrix substrate (the first substrate) different from that of Embodiment 1 is manufactured. Note that the processes described in the Japanese Patent Application No. Hei 11-104646 is used for the details of the TFT manufacturing processes.

A low-alkaline glass substrate or a quartz substrate can be used as a substrate 1501. On the surface of this substrate 1501 on which TFTs are to be formed, a base film 1502 such as a silicon oxide film, a silicon nitride film or a silicon oxynitride film is formed in order to prevent the diffusion of impurities from the substrate 1501.

Next, a semiconductor film that has an amorphous structure and a thickness of 20 to 150 nm preferably, 30 to 80 nm) is formed by a known method such as plasma CVD or sputtering. In this embodiment, an amorphous silicon film was formed to a thickness of 55 nm by plasma CVD. Then, by a known crystallization technique, a crystalline silicon film is formed from the amorphous silicon film. For example, a laser crystallization method or a thermal crystallization method (solid phase growth method) may be applied, however, here, in accordance with the technique disclosed in Japanese Patent Application Laid-Open No. Hei 7-130652, the crystalline silicon film was formed by the crystallization method using a catalytic element.

Then, the crystalline silicon film is divided into islands, whereby island semiconductor layers are formed. Thereafter, a mask layer of a silicon oxide film is formed to a thickness of 50 to 100 nm by plasma CVD or sputtering. Then, a resist mask is provided, and onto the whole surfaces of the island semiconductor layers forming the n-channel TFTs, boron (B)

was added as an impurity element imparting p-type conductivity, at a concentration of about $1\times10^{16}$ to $5\times10^{17}$ atoms/$cm^3$, for the purpose of controlling the threshold voltage. Next, in order to form the LDD regions of the n-channel TFTs in the driver circuit, an impurity element imparting n-type conductivity is selectively added to the island semiconductor layers. For this purpose, resist masks were formed in advance. Next, the mask layers are removed by hydrofluoric acid or the like, and the step of activating the added impurity elements is carried out. The activation can be carried out by performing heat treatment in a nitrogen atmosphere at 500 to 600° C. for 1 to 4 hours or by using the laser activation method. Further, both methods may be jointly performed. In this embodiment a laser activation method was employed.

Then, a gate insulator film 1520 is formed of an insulator film comprising silicon to a thickness of 10 to 150 nm, by plasma CVD or sputtering. Next, a conductive layer (A) comprising a conductive metal nitride film and a conductive layer (B) comprising a metal film are laminated. The conductive layer (B) may be formed of an element selected from among tantalum (Ta), titanium (Ti), molybdenum (Mo) and tungsten (W) or an alloy comprised mainly of the above-mentioned element, or an alloy film (typically, an Mo—W alloy film or an Mo—Ta alloy film) comprised of a combination of the above-mentioned elements, while the conductive layer (A) comprises tantalum nitride (TaN), tungsten nitride (WN), titanium nitride (TiN), or molybdenum nitride (MoN). In this embodiment, as the conductive layer (A), a tantalum nitride film with a thickness of 30 nm was used, while, as a the conductive layer (B), a Ta film with a thickness of 350 nm was used, both films being formed by sputtering.

Next, resist masks are formed, and the conductive layer (A) and the conductive layer (B) are etched together to form gate electrodes 1528 to 1531 and a capacitor wiring 1532.

Then, in order to form the source region and the drain region of the p-channel TFT in the driver circuit, the step of adding an impurity element imparting p-type conductivity is carried out. Here, by using the gate electrode 1528 as a mask, impurity regions are formed in a self-alignment manner. In this case, the region in which the n-channel TFT will be formed is coated with a resist mask in advance.

Next, in the n-channel TFTs, impurity regions that functioned as source regions or drain regions were formed.

Then, the step of adding an impurity imparting n-type for formation of the LDD regions of the n-channel TFT in the pixel matrix circuit was carried out. Thereafter, in order to activate the impurity elements, which were added at their respective concentrations for imparting n-type or p-type conductivity, an activation, process was performed by furnace annealing in a nitrogen atmosphere. By this heat treatment of the activation process performed here, the catalytic element could be gettered from the channel-forming region of the n-channel and the p-channel TFTs. In this heat treatment metal nitride layers are formed on the surfaces of the gate wirings 1528 to 1531 and the capacitance wiring 1532 which exists over an impurity region 1527 with the gate insulating film 1520 interposed therebetween. Further, a hydrogenation process of the island semiconductor layers is performed.

After the activation and hydrogenation steps are over, gate wirings 1547 and 1548, and capacitance wiring 1549 was formed.

A first interlayer insulating film 1550 is formed of a silicon oxide film or a silicon oxynitride film with a thickness of 500 to 1500 nm, and contact holes reaching the source regions or the drain regions, which are formed in the respective island semiconductor layers, are formed; and source wirings 1551 to 1554 and drain wirings 1555 to 1558 are formed. Next, as a passivation film 1559, a silicon nitride film, a silicon oxide film or a silicon oxynitride film is formed to a thickness of 50 to 500 nm (typically, 100 to 300 nm).

Thereafter, a second interlayer insulating film 1560 comprised of an organic resin is formed to a thickness of 1.0 to 1.5 μm. Then, a contact hole reaching the drain wiring 1558 in contact with drain region 1526 is formed in the second interlayer insulating film 1560, and pixel electrodes 1561 and 1562 are formed. The pixel electrodes can be formed by using a transparent conductive film in the case a transmission type liquid crystal display device is to be obtained, while, in the case a reflection type liquid crystal display device is to be fabricated, the pixel electrodes can be formed by a metal film.

Next, a columnar spacer 1607 is formed. Since the step of forming the columnar spacer 1607 is the same as the spacer fabricating step of the embodiment 3, its explanation is omitted. Next, similarly to the embodiment 3, an alignment film 1601 covering the columnar spacer 1607 is formed. After the alignment film is formed, a rubbing processing is performed so that the liquid crystal molecules are oriented at a constant pretilt angle (6° to 10°, preferably 7° to 8°). A light-shielding film 1603, a transparent conductive film 1604, and an alignment film 1605 are formed on an opposite substrate 1602 at the opposite side. An active matrix substrate on which a pixel matrix circuit and a CMOS circuit are formed is bonded to the opposite substrate by a well-known cell assembling step. Thereafter, a liquid crystal material 1606 is injected between both the substrates, and complete sealing is made by a sealant (not shown). An well-known liquid crystal material may be used for the liquid crystal material. In this way, an active matrix type liquid crystal display device shown in FIG. 20 is completed.

Figure 20:
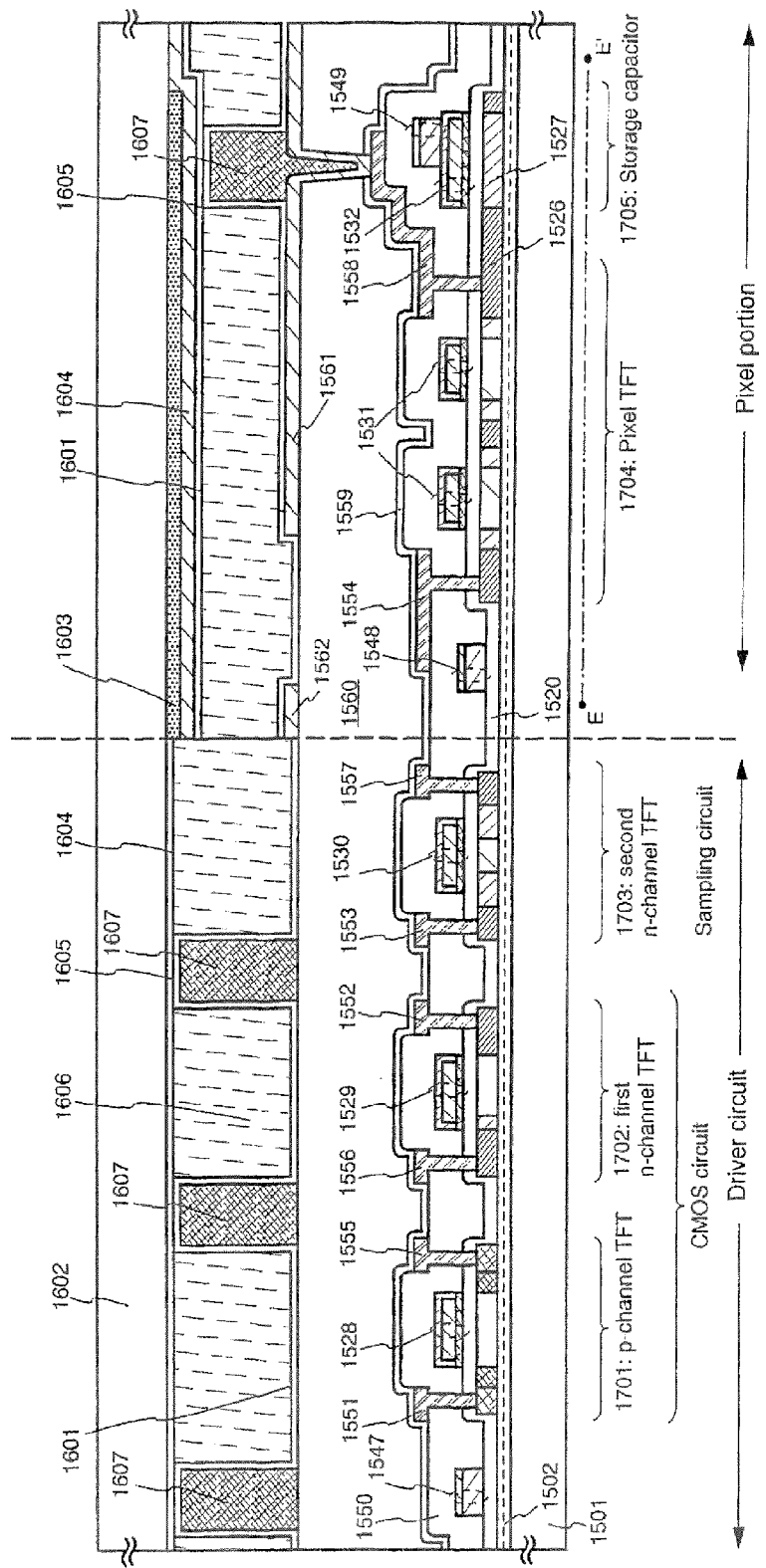
FIG. 20 is a sectional structural view of an active matrix type liquid crystal display device.

In FIG. 20, a p-channel TFT 1701, a first n-channel TFT 1702, and a second n-channel TFT 1703 are formed in the driver circuit, and a pixel TFT 1704 and a storage capacitance 1705 are formed in a display region.

Incidentally, this embodiment can be freely combined with the embodiments 1 to 4.

[Embodiment 6]

In this embodiment, a description will be made on an example in which a display device is fabricated by using a TFT different from the above embodiment.

In the above embodiment, although a top-gate type TFT is used, in this embodiment, a first substrate is fabricated by using a bottom-gate type TFT.

Figure 21:
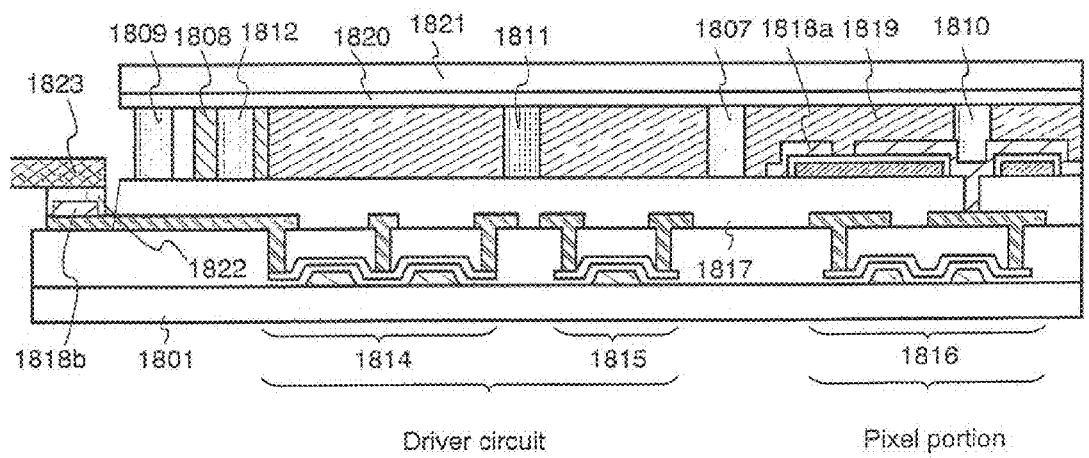
FIG. 21 is a sectional structural view of an active matrix type liquid crystal display device.

In FIG. 21, reference numeral 1814 designates a CMOS circuit; 1815, an n-channel TFT; 1816, a pixel TFT; 1817, an interlayer insulating film; 1818a, a pixel electrode; and 1818b, an ITO film. This ITO film 1818b is provided to be connected to an external terminal such as an FPC 1823. Besides, reference numeral 1819 designates a liquid crystal material; and 1820, an opposite electrode. Besides, reference numeral 1801 designates a first substrate; 1808, a sealing region; and 1821, a second substrate. Reference numeral 1822 denotes an adhesive.

Besides, in this embodiment, columnar spacers 1807 are provided between a pixel portion and a source side driver circuit, columnar spacers 1809 are provided at an external connection terminal portion, columnar spacers 1810 are provided at the pixel portion, columnar spacers 1811 are provided at a gate side driver circuit, and columnar spacers 1812 are provided at the sealing region. The respective columnar spacers are provided at a constant interval by a photolithography method. Like this, by providing the columnar spacers at a constant interval, a uniform substrate interval can be maintained. Besides, by providing the columnar spacers 1812 at the sealing region, a filler may not be used. Besides, by providing the columnar spacers 1809 at the external connection terminal portion, the mechanical strength at the connection portion can be reinforced. Incidentally, the foregoing respective columnar spacers may be formed by the fabricating method shown in the embodiment 1 or the embodiment 3.

Incidentally, a fabricating process for obtaining the above TFT structure may use a well-known technique, and is not particularly limited.

Incidentally, this embodiment can be freely combined with the embodiments 1 to 4.

[Embodiment 7]

In this embodiment, a case where a columnar spacer of the present invention is applied to a liquid crystal display device equipped with a touch panel, will be described with reference to FIG. 22A and FIG. 22B.

Figure 22A:
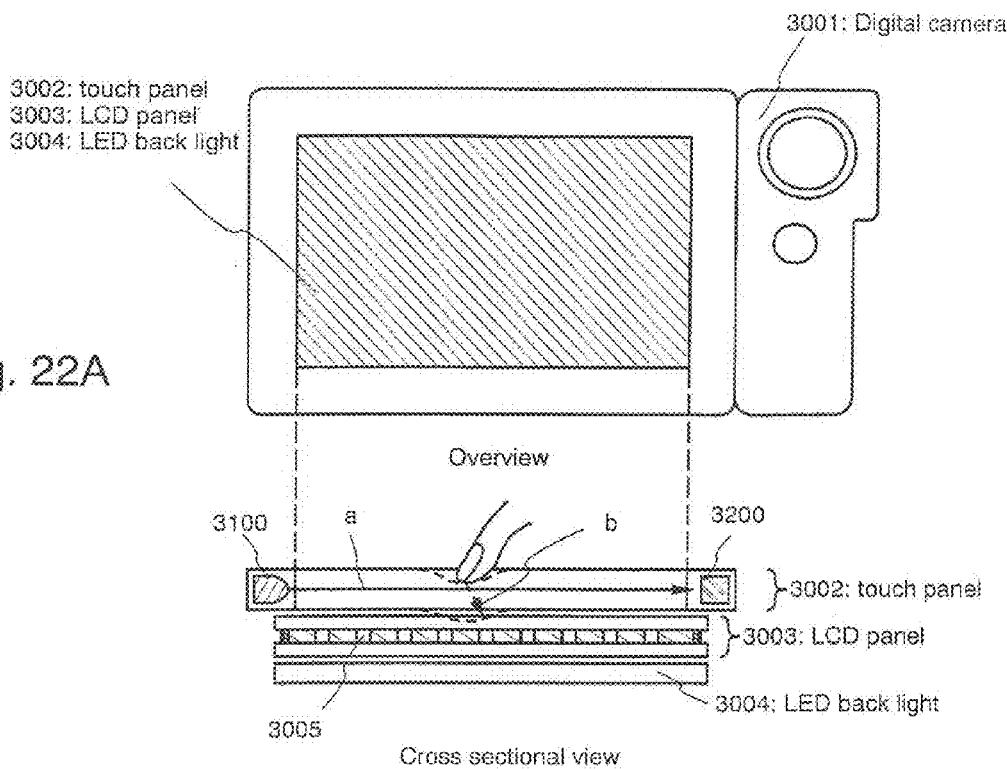
FIGS. 22A and 22B are views showing display devices each including a touch panel.

FIG. 22A is an external appearance view and a sectional view of a portable information terminal device equipped with an optical touch panel 3002.

In FIG. 22A, reference numeral 3001 designates a digital camera; 3002, a touch panel; 3003, a liquid crystal panel; 3004, an LED backlight; 3100, a light emitting element; and 3200, a light receiving element.

In the display device equipped with this touch panel, when a fingertip or a pen tip touches the surface of the touch panel 3002, part of a light path "a" from the light emitting element 3100 provided at the end portion of the panel is interrupted, and part of light advances to a light path "b". Since the light receiving element 3200 corresponding to the light emitting element having the light path "a", the part of which is interrupted does not receive light, it is possible to detect a temporal positional change of a touched place.

In this embodiment, columnar spacers 3005 of the present invention were used for the liquid crystal panel 3003. The columnar spacers are formed by the fabricating method described in the embodiment 1 or the embodiment 3. By doing so, the mechanical strength is reinforced, and a strong panel can be made. Besides, by means of the columnar spacers of the present invention, the substrate interval is hardly changed by pressure from the outside (from the fingertip or pen tip), so that a display image is not easily disturbed.

Incidentally, in this embodiment, a transmission type LCD panel using the LED backlight is used. However, a reflection type LCD panel using no backlight may be used. Besides, an LCD panel which can be freely changed to the reflection type or transmission type in accordance with the amount of outer light may be used.

Figure 22B:
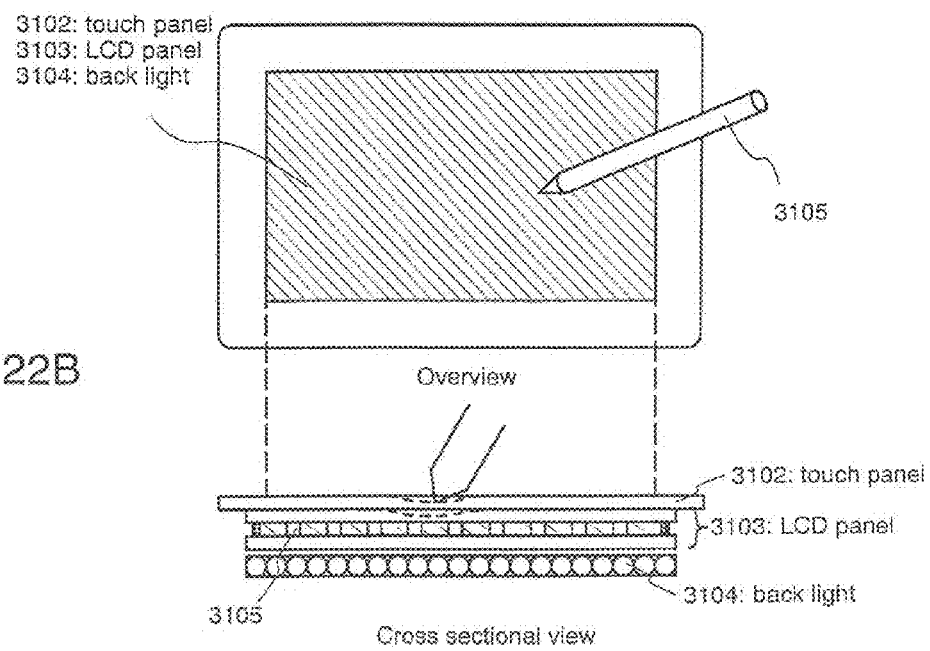

FIG. 22B is an outer appearance view and a sectional view of a portable information terminal device equipped with a pen input type touch panel 3102.

In FIG. 22B, reference numeral 3102 designates a touch panel; 3103, a liquid crystal panel; 3104, a backlight; and 3105, an input pen.

In the display device equipped with this touch panel, a pressure sensitive type or capacitive type detecting element is provided on the surface of the touch panel 3102. When the input pen 3105 touches it, a temporal positional change can be detected by the detecting element.

In this embodiment, columnar spacers 3106 of the present invention were used for the liquid crystal panel 3103. The columnar spacers are formed by the fabricating method described in the embodiment 1 or the embodiment 3. By doing so, the mechanical strength is reinforced, and a strong panel can be made. Besides, by means of the columnar spacers of the present invention, the substrate interval is hardly changed by pressure from the outside (from the fingertip or pen tip), so that a display image is not easily disturbed. Since the touch panel 3102 in which the pressure sensitive type or capacitive type detecting element is provided is in direct contact with the LCD panel 3103, the LCD panel 3103 easily receives pressure from the outside and it is effective.

Incidentally, the structure of this embodiment can be freely combined with any structure of the embodiments 1 to 6.

[Embodiment 8]

A case of applying the present invention to a reflection type liquid crystal display device formed over a silicon substrate is described. TFT structure may be realized by adding impurity elements imparting n-type or p-type directly to the silicon substrate (silicon wafer) instead of the active layers comprising the crystalline silicon film in Embodiment 1. Further, because a reflection type is formed, a metallic film having a high reflectance (for example aluminum, silver or an alloy of these (Al—Ag alloy) and so forth may be used as the pixel electrode.

Note that it is possible to freely combine the constitutions of the present embodiment with any of Embodiments 1 to 7.

[Embodiment 9]

The present invention can also be applied to the case in which an interlayer insulating film is formed over a conventional MOSFET and a TFT is formed thereon. That is, it is also possible to realize a three-dimensionally structured semiconductor device. Further it is possible to use an SOI substrate such as a SIMOX, Smart-Cut (registered trademark by SOITEC INC.), ELTRAN (registered trademark by CANON INC.), etc.

It is possible to freely combine the constitutions of the present embodiment with any of the structures of Embodiments 1 to 8.

[Embodiment 10]

It is possible to apply the present invention to an active matrix EL (electro luminescence) display device. An example is shown in FIG. 23.

Figure 23:
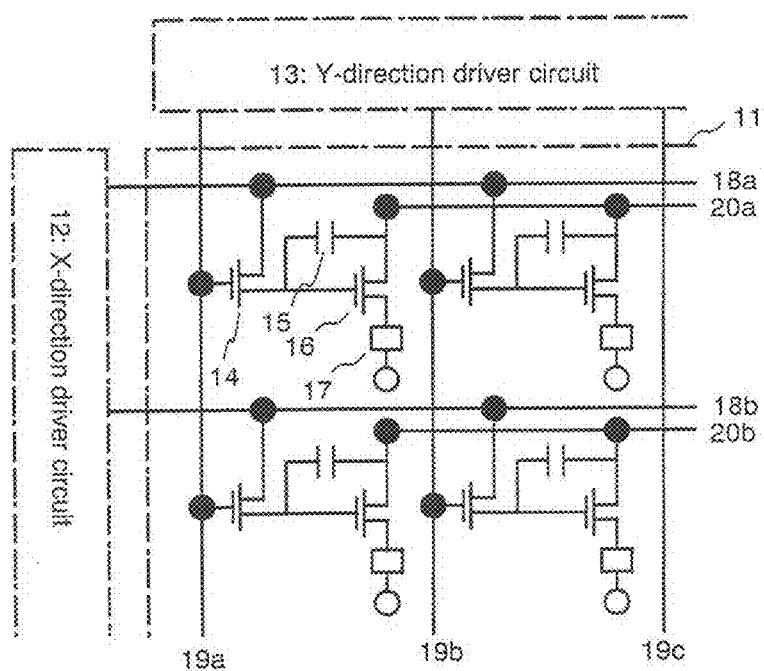
FIG. 23 is a view showing a structure of an active matrix type EL display device.

FIG. 23 is a circuit diagram of the active matrix EL display device. Reference numeral 11 denotes a pixel section; and X-direction driver circuit 12 and Y-direction driver circuit 13 are provided in its peripheral. Each pixel of the display section 11 comprises a to switching TFT 14, a storage capacitor 15, a current control TFT 16, an organic EL element 17. X-direction signal line 18a (or 18b) and a Y-direction signal line 19a (or 19b or 19c) are connected to the switching TFT 14. Power supply lines 20a and 20b are connected to the current control TFT 16.

In the active matrix EL display device of the present embodiment, TFTs used for the X-direction driver circuit 12 and the Y-direction driver circuit 13 are formed by combining a p-channel TFT 701 and an n-channel TFTs 702 or 703 of FIG. 8B. The switching TFT 14 and the current control TFT 16 are formed from an n-channel TFT 704 of FIG. 8B.

[Embodiment 11]

It is possible to use a variety of liquid crystal materials in a liquid crystal display device manufactured in accordance with the present invention. The following can be given as examples of the such materials: a TN liquid crystal; a PDLC (polymer diffusion type liquid crystal); an FLC (ferroelectric liquid crystal); an AFLC (antiferroelectric liquid crystal); and a mixture of an FLC and an AFLC.

For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; and in U.S. Pat. No. 5,594,569 can be used.

In particular, when an antiferroelectric liquid crystal having no threshold (thresholdless) (thresholdless antiferroelectric LCD: abbreviated to TL-AFLC) is used, in some cases the power supply voltage of 5 to 8 is sufficient because the operating voltage of liquid crystal is reduced to approximately ±2.5V. Namely, it becomes possible to drive the driver circuits and the pixel matrix circuits at the same power supply voltage, so that the electric power consumption of the liquid crystal display device as a whole can be reduced.

Further, there are some that exhibit electro-optical response characteristics of V shape among thresholdless antiferroelectric LCD and those having the driver voltage of approximately ±2.5 V (cell thickness approximately 1 to 2 mm) is even found.

Figure 24:
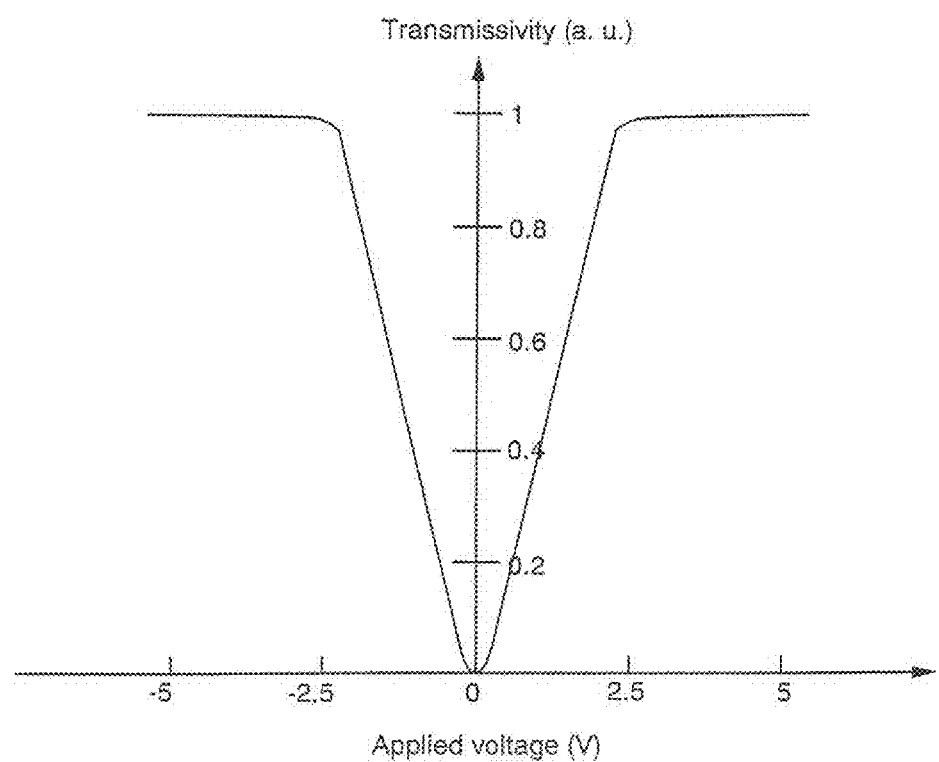
FIG. 24 is a view showing characteristics of light transmissivity of a thresholdless antiferroelectric mixed liquid crystal to applied voltage.

The characteristic of light transmittivity against applied voltage, of a thresholdless antiferroelectric mixed liquid crystal which shows a V-shaped electro-optical response is shown here in FIG. 24. The vertical axis of the graph shown in FIG. 24 is the transmissivity (in arbitrary units), and the horizontal axis is the applied voltage. Note that the transmission axis of the polarizing plate on the incidence side is set nearly in agreement with the rubbing direction of the liquid crystal display device, and nearly parallel to the direction normal to the smectic layer of the thresholdless antiferroelectric mixed liquid crystal. Further, the transmission axis of the polarizing plate on the outgoing side is set nearly perpendicular (crossed Nicols) to the transmission axis of the polarizing plate on the incidence side.

Further, ferroelectric liquid crystals and anti-ferroelectric liquid crystals possess an advantage in that they have a high response speed compared to TN liquid crystals. Since it is possible to realize an extremely fast operating speed TFT used in the present invention, it is possible to realize a liquid crystal display device with fast image response speed by sufficiently utilizing the fast response speed of ferroelectric liquid crystals and antiferroelectric liquid crystals.

It is needless to say that the use of the liquid crystal display device of the present embodiment to a display for an electronic device such as a personal computers, etc., is effective.

It is possible to freely combine the constitutions of the present embodiment with any constitutions of Embodiments 1 to 10.

[Embodiment 12]

The TFTs formed by implementing the present invention can be used in various electro-optical devices. Namely the present invention can be implemented on all of the electronic appliances that incorporate these electro-optical devices as a display.

The following can be given as examples of this type of electronic appliances: video cameras; digital cameras; head mounted displays (goggle type displays); wearable displays; car navigation systems; personal computers; portable information terminals (such as mobile computers, portable telephones and electronic notebooks). Some examples of these are shown in FIGS. 25A to 25F.

Figure 25A:
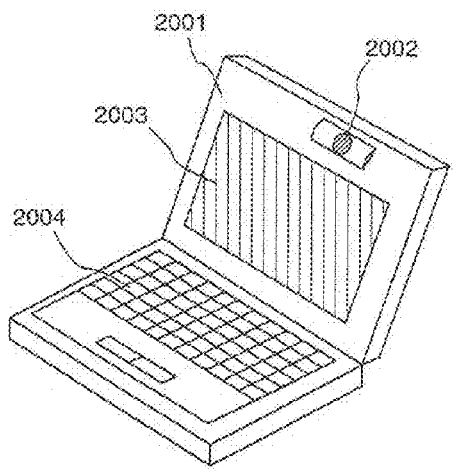
FIGS. 25A to 25F are views showing examples of electronic devices.

FIG. 25A is a personal computer, which comprises: a main body 2001; an image input section 2002; a display section 2003; and a keyboard 2004. The present invention can be applied to the image input section 2002, display section 2003 and other driver circuits.

Figure 25B:
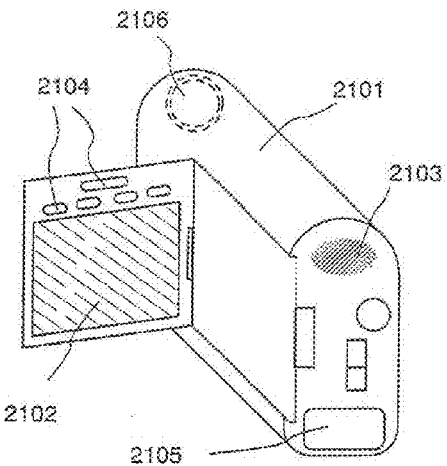

FIG. 25B is a video camera, which comprises: a main body 2101; a display section 2102; a voice input section 2103; operation switches 2104; a battery 2105; and an image receiving section 2106. The present invention can be applied to the display section 2102, the voice input section 2103 or other driver circuits.

Figure 25C:
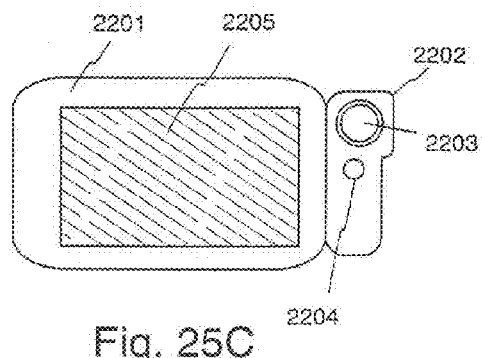

FIG. 25C is a mobile computer which comprises: a main body 2201; a camera section 2202; an image receiving section 2203; operation switches 2204; and a display section 2205. The present invention can be applied to the display section 2205 or other driver circuits.

Figure 25D:
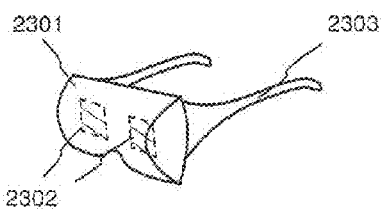

FIG. 25D is a goggle type display which comprises: a main body 2301; a display section 2302; and an arm section 2303. The present invention can be used for the display section 2302 or other driver circuits.

Figure 25E:
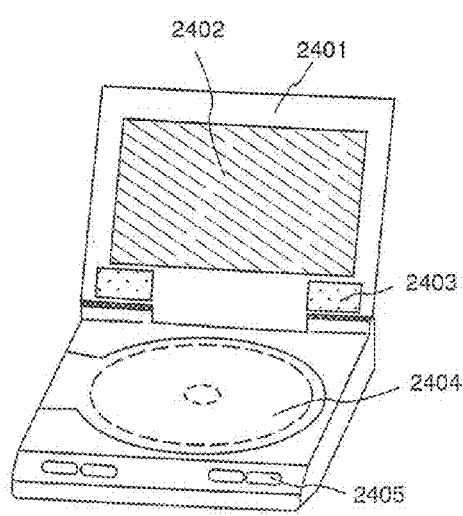

FIG. 25E is a player that uses a recording medium on which a program is recorded (hereinafter referred to as a recording medium), which comprises: a main body 2401; a display section 2402; a speaker section 2403; a recording medium 2404; and operation switches 2405 etc. Note that music appreciation, film appreciation, games, and the use of the Internet can be performed with this device using a DVD (digital versatile disk), a CD, etc., as a recording medium. The present invention can be applied to the display sections 2402 or other driver circuits.

Figure 25F:
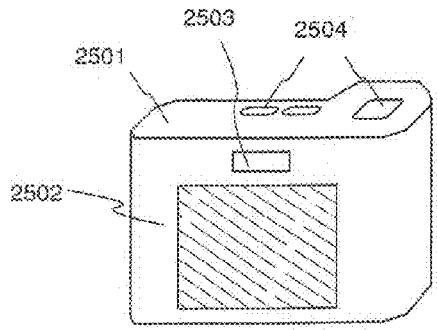

FIG. 25F is a digital camera which comprises: a main body 2501; a display section 2502; a view finder section 2503; operation switches 2504; and an image receiving section (not shown in the figure). The present invention can be applied to the display section 2502 or other driver circuits.

As described above, the applicable range of the active matrix display device of the present invention is very large, and it is possible to apply to electronic appliances of various areas. Further, the electric appliances of the present embodiment can be realized by any combination of constitutions of Embodiments 1 to 9 and 11.

[Embodiment 13]

The TFTs formed by implementing the present invention can be used in various electro-optical devices. Namely the present invention can be implemented on all of the electronic appliances that incorporate these electro-optical devices as a display.

Projectors (rear type or front type) can be given as such electronic appliances. The examples are shown in FIGS. 26A to 26D.

FIG. 26A is a front projector which comprises a display section 2601 and a screen 2602. The present invention can be applied to the display section 2601 or other driver circuits.

FIG. 26B is a rear projector which comprises: a main body 2701, a display section 2702, a mirror 2703 and a screen 2407. The present invention can be applied to the display section 2702 or other driver circuits.

Note that FIG. 26C is a diagram showing an example of the structure of the display sections 2601 and 2702 in FIGS. 26A and 26B. The display sections 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system including projection lens. Though the present embodiment shows an example of 3-plate type, it is not limited to the 3-plate type, for example, single plate type is appropriate. Further, an operator may properly dispose an optical lens, a film having light polarizing function, a film adjusting phase difference, IR films and so forth in the optical path shown by an arrow in FIG. 26C.

FIG. 26D is a diagram showing an example of the structure of the optical light source system 2801 in FIG. 26C. In the present embodiment the optical light source system 2801 comprises: a reflector 2811; a light source 2812; lens arrays 2813 and 2814; light polarizing conversion element 2815; and a condenser lens 2816. Note that the optical light source system shown in FIG. 26D is merely an example and the structure is not specifically limited. For example, an operator may properly dispose an optical lens, a film having light polarizing function, a film adjusting phase difference, IR films and so forth in the optical light source system. As described above, the applicable range of the present invention is very large, and it is possible to apply to electronic appliances of various areas. Further, the electric appliances of the present embodiment can be realized by any combination of the constitutions of Embodiments 1 to 9 and 11.

By using the columnar spacer of the present invention, it is possible to provide, without using a particulate spacer, a high quality liquid crystal panel having a thickness with high accuracy, which is designed within a free range in accordance with characteristics of a used liquid crystal and a driving method.

Besides, by adopting the shape of the columnar spacer of the present invention, defective orientation in liquid crystal can be prevented.

Besides, by using the columnar spacer of the present invention, a load applied to an element is reduced, and it becomes possible to prevent the lowering of yield due to element destruction or the like and lowering of reliability. Like this, it is possible to achieve the improvement of operation performance and improvement of reliability of an electro-optical device typified by a liquid crystal display device.

What is claimed is:

1. A display device comprising:
a first substrate;
a gate electrode over the first substrate;
a semiconductor layer overlapping with the gate electrode;
a first insulating layer disposed between the gate electrode and the semiconductor layer;
a first conductive layer over and electrically connected the semiconductor layer;
a second conductive layer over and electrically connected the semiconductor layer;
a second insulating layer over the gate electrode, the first conductive layer, and the second conductive layer:
a pixel electrode over the second insulating layer, the pixel electrode electrically connected to the first conductive layer;
a second substrate opposed to the first substrate;
a liquid crystal material disposed between the first substrate and the second substrate;
a first photolithographic spacer disposed between the first substrate and the second substrate; and
a second photolithographic spacer disposed between the first substrate and the second substrate,
wherein the first photolithographic spacer and the second photolithographic spacer are disposed in a region surrounded by a sealing region,
wherein each of the gate electrode, the first insulating layer, the semiconductor layer, the first conductive layer, and the pixel electrode overlaps with the first photolithographic spacer,
wherein each of the gate electrode, the semiconductor layer, the first conductive layer, the second conductive layer, and the pixel electrode does not overlap with the second photolithographic spacer, and
wherein the first photolithographic spacer has a cross-section in which a width of a second substrate side end portion of the first photolithographic spacer is larger than a width of a center portion of the first photolithographic spacer, and the width of the center portion of the first photolithographic spacer is larger than a width of a first substrate side end portion of the first photolithographic spacer.

2. The display device according to claim 1, wherein a sectional shape of the first photolithographic spacer in a radial direction is one selected from the group consisting of a circle, an ellipse, a triangle, a quadrilateral, and a polygon having sides more than four.

3. The display device according to claim 1, wherein the first photolithographic spacer is disposed between the pixel electrode and the second substrate.

4. The display device according to claim 1, further comprising:
a touch detection element overlapping with the liquid crystal material, wherein the touch detection element is any one of an optical detecting element, a pressure sensitive type detecting element, and a capacitive type detecting element.

5. The display device according to claim 4, further comprising:
an LED backlight overlapping with the liquid crystal material.

6. The display device according to claim 1, wherein the pixel electrode electrically connected to the first conductive layer so that a part of the pixel electrode is located in a contact hole of the second insulating layer.

7. The display device according to claim 1, further comprising:
an alignment film disposed between the pixel electrode and the first photolithographic spacer.

8. The display device according to claim 1, wherein the gate electrode is located under the semiconductor layer.

9. A display device comprising:
a first substrate;
a gate electrode over the first substrate;
a semiconductor layer overlapping with the gate electrode;
a first insulating layer disposed between the gate electrode and the semiconductor layer;
a first conductive layer over and electrically connected the semiconductor layer;
a second conductive layer over and electrically connected the semiconductor layer;
a second insulating layer over the gate electrode, the first conductive layer, and the second conductive layer;
a pixel electrode over the second insulating layer, the pixel electrode electrically connected to the first conductive layer;
a second substrate opposed to the first substrate;
a liquid crystal material disposed between the first substrate and the second substrate; and
a first spacer disposed between the first substrate and the second substrate, the first spacer comprising a photopolymerization type insulating film; and
a second spacer disposed between the first substrate and the second substrate, the second spacer comprising a photopolymerization type insulating film,
wherein the first spacer and the second spacer are disposed in a region surrounded by a sealing region,
wherein each of the gate electrode, the first insulating layer, the semiconductor layer, the first conductive layer, and the pixel electrode overlaps with the first spacer,
wherein each of the gate electrode, the semiconductor layer, the first conductive layer, the second conductive layer, and the pixel electrode does not overlap with the second spacer, and
wherein the first spacer has a cross-section in which a width of a second substrate side end portion of the first spacer is larger than a width of a center portion of the first spacer, and the width of the center portion of the first spacer is larger than a width of a first substrate side end portion of the first spacer.

10. The display device according to claim 9, wherein a sectional shape of the first spacer in a radial direction is one selected from the group consisting of a circle, an ellipse, a triangle, a quadrilateral, and a polygon having sides more than four.

11. The display device according to claim 9, wherein the first spacer is disposed between the pixel electrode and the second substrate.

12. The display device according to claim 9, further comprising:
a touch detection element overlapping with the liquid crystal material, wherein the touch detection element is any one of an optical detecting element, a pressure sensitive type detecting element, and a capacitive type detecting element.

13. The display device according to claim 12, further comprising:
an LED backlight overlapping with the liquid crystal material.

14. A display device comprising:
a first substrate;
a gate electrode over the first substrate;
a semiconductor layer overlapping with the gate electrode;
a first insulating layer disposed between the gate electrode and the semiconductor layer;
a first conductive layer over and electrically connected the semiconductor layer;
a second conductive layer over and electrically connected the semiconductor layer;
a second insulating layer over the gate electrode, the first conductive layer, and the second conductive layer;
a pixel electrode over the second insulating layer, the pixel electrode electrically connected to the first conductive layer;
a second substrate opposed to the first substrate;
a liquid crystal material disposed between the first substrate and the second substrate; and
a first spacer disposed between the first substrate and the second substrate, the first spacer comprising a positive or negative type photosensitive resin; and a second spacer disposed between the first substrate and the second substrate, the second spacer comprising a positive or negative type photosensitive resin,
wherein the first spacer and the second spacer are disposed in a region surrounded by a sealing region,
wherein each of the gate electrode, the first insulating layer, the semiconductor layer, the first conductive layer, and the pixel electrode overlaps with the first spacer,
wherein each of the gate electrode, the semiconductor layer, the first conductive layer, the second conductive layer, and the pixel electrode does not overlap with the second spacer, and
wherein the first spacer has a cross-section in which a width of a second substrate side end portion of the first spacer is larger than a width of a center portion of the first spacer, and the width of the center portion of the first spacer is larger than a width of a first substrate side end portion of the first spacer.

15. The display device according to claim 14, wherein a sectional shape of the first spacer in a radial direction is one selected from the group consisting of a circle, an ellipse, a triangle, a quadrilateral, and a polygon having sides more than four.

16. The display device according to claim 14, wherein the photosensitive resin is polyimide or acrylic.

17. The display device according to claim 14, wherein the first spacer is disposed between the pixel electrode and the second substrate.

18. The display device according to claim 14, further comprising:
a touch detection element overlapping with the liquid crystal material,
wherein the touch detection element is any one of an optical detecting element, a pressure sensitive type detecting element, and a capacitive type detecting element.

19. The display device according to claim 18, further comprising:
an LED backlight overlapping with the liquid crystal material.

* * * * *

UNITED STATES PATENT AND TRADEMARK OFFICE
CERTIFICATE OF CORRECTION

Page 1 of 2

PATENT NO. : 9,069,215 B2
APPLICATION NO. : 12/556135
DATED : June 30, 2015
INVENTOR(S) : Yoshiharu Hirakata et al.

It is certified that error appears in the above-identified patent and that said Letters Patent is hereby corrected as shown below:

In the Specification:

Col. 3, line 44, ", a and a touch panel" should read --, and a touch panel--

Col. 5, line 25, "has a that surface" should read --has a flat surface--

Col. 6, lines 55, "in brief FIGS. 3A" should read --in brief. FIGS. 3A--

Col. 7, line 14, "forming a scaling" should read --forming a sealing--

Col. 9, lines 12, "can be a used." should read --can be used.--

Col. 10, line 2, "element boron in this Embodiment)" should read --element (boron in this Embodiment)--

Col. 10, line 4, "$5 \times 10^{17}$ atoms/cm$^{-3}$" should read --$5 \times 10^{17}$ atoms/cm$^3$--

Col. 10, line 5, "n-channel TFTS." should read --n-channel TFTs.--

Col. 11, line 65, "farmed" should read --formed--

Col. 12, line 3, "Ten, n-type" should read --Then, n-type--

Col. 13, line 43, "$1 \times 10^{37}$ atoms/cm$^3$" should read --$1 \times 10^{17}$ atoms/cm$^3$--

Col. 14, line 24, "after the to film" should read --after the film--

Col. 15, line 35, "to 0.100 nm" should read --to 100 nm--

Signed and Sealed this
Ninth Day of February, 2016

Michelle K. Lee
*Director of the United States Patent and Trademark Office*

CERTIFICATE OF CORRECTION (continued)
U.S. Pat. No. 9,069,215 B2

In the Specification:

Col. 17, line 12, "appearance, FIG. 2A" should read --appearance. FIG. 2A--

Col. 17, line 39, "FIG. 5B" should read --FIG. 8B--

Col. 17, line 47, "FIG. 5B" should read --FIG. 8B--

Col. 19, line 9, "impurity legion" should read --impurity region--

Col. 19, line 29, "FIG. 5B" should read --FIG. 8B--

Col. 19, line 39, "driver-circuits" should read --driver circuits--

Col. 20, line 14, "FIG. 5B" should read --FIG. 8B--

Col. 20, line 22, "FIG. 5B" should read --FIG. 8B--

Col. 20, line 30, "FIG. 5B" should read --FIG. 8B--

Col. 21, line 61, "terminal portion; 1308," should read
--terminal portion; 1308, a sealing region; and 1321, a second substrate.--

Col. 23, line 29, "as a the" should read --as the--

Col. 23, line 49, "activation, process" should read --activation process--

Col. 26, line 40, "a to switching TFT 14" should read --a switching TFT 14--

Col. 27, line 64, "operation switches. 2014" should read --operation switches 2014--

In the Claims:

Col. 29, line 38, Claim 1, "conductive layer:" should read --conductive layer;--